(12) United States Patent
Hashi et al.

(10) Patent No.: US 11,747,195 B2
(45) Date of Patent: Sep. 5, 2023

(54) LIGHT DETECTION APPARATUS

(71) Applicant: HAMAMATSU PHOTONICS K.K., Hamamatsu (JP)

(72) Inventors: Tatsuya Hashi, Hamamatsu (JP); Shinya Iwashina, Hamamatsu (JP); Takashi Baba, Hamamatsu (JP); Shigeyuki Nakamura, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 17/801,004

(22) PCT Filed: Feb. 15, 2021

(86) PCT No.: PCT/JP2021/005548
§ 371 (c)(1),
(2) Date: Aug. 19, 2022

(87) PCT Pub. No.: WO2021/172071
PCT Pub. Date: Sep. 2, 2021

(65) Prior Publication Data
US 2023/0102241 A1    Mar. 30, 2023

(30) Foreign Application Priority Data

Feb. 28, 2020   (JP) ................................ 2020-033198

(51) Int. Cl.
*G01J 1/44*    (2006.01)
*G01S 7/481*   (2006.01)
(Continued)

(52) U.S. Cl.
CPC .............. *G01J 1/44* (2013.01); *G01S 7/4816* (2013.01); *G01S 7/4876* (2013.01); *G01S 7/493* (2013.01);
(Continued)

(58) Field of Classification Search
CPC ................. G01J 1/44; G01J 2001/4466; G01J 2001/448; G01S 7/4816; G01S 7/4876;
(Continued)

(56) References Cited

U.S. PATENT DOCUMENTS 8,723,100 B2 * 5/2014 Sanfilippo ....... H01L 31/022408
257/443
11,378,687 B2 * 7/2022 Koyama .................. G01C 3/06

FOREIGN PATENT DOCUMENTS

JP     2001-004445 A    1/2001
JP     2018-072097 A    5/2018
(Continued)

OTHER PUBLICATIONS

International Preliminary Report on Patentability dated Sep. 9, 2022 for PCT/JP2021/005548.

*Primary Examiner* — Seung C Sohn
(74) *Attorney, Agent, or Firm* — Faegre Drinker Biddle & Reath LLP

(57) ABSTRACT

In a light detection device, a circuit substrate includes a plurality of signal processing units which process a detection signal output from a corresponding pixel. Light-receiving regions of a plurality of avalanche photodiodes are two-dimensionally arranged for every pixel. In each of the signal processing units, a timing measurement unit measures timing at which light is incident on a corresponding pixel, based on the detection signal. An energy measurement unit measures energy of light incident on a corresponding pixel, based on the detection signal. A storage unit stores a measurement result in the timing measurement unit and the energy measurement unit. A light detection region where a plurality of the pixels are provided and a signal processing region where a plurality of the signal processing units are provided overlap each other at least at a part.

10 Claims, 17 Drawing Sheets

(51) Int. Cl.
    *G01S 7/487* (2006.01)
    *G01S 7/493* (2006.01)
    *H01L 27/144* (2006.01)
(52) U.S. Cl.
    CPC .... *H01L 27/1446* (2013.01); *G01J 2001/448* (2013.01); *G01J 2001/4466* (2013.01)
(58) Field of Classification Search
    CPC ..... G01S 7/493; G01S 7/486; H01L 27/1446; H01L 31/107
    See application file for complete search history.

(56) References Cited

FOREIGN PATENT DOCUMENTS

| WO | WO-2004/027454 A1 | 4/2004 |
|----|-------------------|--------|
| WO | WO-2013/058001 A1 | 4/2013 |
| WO | WO-2018/181307 A1 | 10/2018 |
| WO | WO-2019/216242 A1 | 11/2019 |

\* cited by examiner

LIGHT DETECTION APPARATUS

TECHNICAL FIELD

The present invention relates a light detection device.

BACKGROUND ART

There is known a technology of performing detection of a target and distance measurement up to the target by detecting light that is projected from a light source and then is reflected from the target (for example, refer to Patent Literature 1). This technology is referred to, for example, as light detection and ranging (LiDAR). Hereinafter, "detection of a target" and "distance measurement up to a target" will be collectively referred to as "detection operation". A device that performs the detection operation by the LiDAR is referred to as "measurement device". Patent Literature 1 discloses a scanning type measurement device that performs scanning with light emitted from a light source by a scanning unit and detects reflected light from a target.

CITATION LIST

Patent Literature

Patent Literature 1: Japanese Unexamined Patent Publication No. 2018-72097

SUMMARY OF INVENTION

Technical Problem

The scanning type measurement device has an operation site which mechanically operate in the scanning unit to sequentially detect reflected light from a region of a detection target by performing scanning with light from a light source. Accordingly, in the scanning type measurement device, there is a problem in that a failure is likely to occur in the scanning unit. In the scanning type measurement device, there is also a problem in that an accurate detection operation is not performed due to movement of the target during scanning with light. To solve the problems, a flash type measurement device that two-dimensionally and simultaneously projects light from a light source toward a region of the detection target, and detects reflected light from the region is considered. With the flash type measurement device, a detection operation in a wide region can be performed even when scanning with light is not performed. In a case where the scanning unit that performs scanning with light from the light source is not provided, the failure of the scanning unit does not occur, and the problem based on movement of the target during scanning with light is also solved. It is considered that the flash type measurement device can further improve robustness in comparison to the scanning type measurement device, and it is possible to shorten the detection operation time in the region of the detection target.

However, there are various problems in performing the detection operation without using the scanning unit. For example, in a case where light is simultaneously projected to a two-dimensional region without using the scanning unit, in detection of the reflected light through the projection, it is necessary to two-dimensionally arrange a plurality of pixels configured to detect light in the light detection device. In the detection operation with the flash type measurement device, since light is simultaneously projected to a region of the detection target from the light source, intensity of reflected light from each site of the region becomes weaker in comparison to the detection operation with the scanning type measurement device. Accordingly, it is demanded to improve sensitivity in each pixel. In the detection operation with the flash type measurement device, since light that is simultaneously projected to the region of the detection target is detected, disturbance light is also likely to be detected in addition to the reflected light from the target. Therefore, it is difficult to distinguish the disturbance light and the reflected light in the target. To solve the problems in the flash type measurement device, it is demanded to improve accuracy and precision of detection in the light detection device.

An object of an aspect of the invention is to provide a light detection device which has a compact configuration and in which accuracy and precision of detection are improved even in the case of being used in a flash type measurement device.

Solution to Problem

According to an aspect of the invention, there is provided a light detection device including a light detection substrate and a circuit substrate. The light detection substrate includes a semiconductor substrate. The semiconductor substrate includes a first main surface and a second main surface which are opposite to each other. The light detection substrate includes a light detection region. The light detection region is provided with a plurality of pixels which are two-dimensionally arranged when viewed from a direction orthogonal to the first main surface. The circuit substrate is connected to the light detection substrate in a direction orthogonal to the first main surface. The circuit substrate includes a signal processing region. The signal processing region is provided with a plurality of signal processing units configured to process a detection signal output from a corresponding pixel. The light detection substrate includes a plurality of avalanche photodiodes, a plurality of quenching resistors, and a pad electrode for every pixel. Each of the plurality of avalanche photodiodes includes a light-receiving region provided in the semiconductor substrate, and is arranged to operate in Geiger mode. Each of the plurality of quenching resistors is electrically connected to a corresponding one of the avalanche photodiodes in series. The plurality of quenching resistors are electrically connected to the pad electrode in parallel. The light-receiving regions of the plurality of avalanche photodiodes are two-dimensionally arranged for every pixel when viewed from a direction orthogonal to the first main surface. Each of the signal processing units includes a signal acquisition unit, a timing measurement unit, an energy measurement unit, and a storage unit. The signal acquisition unit acquires a detection signal through a corresponding pad electrode corresponding to the pad electrode. The timing measurement unit measures timing at which light is incident on a corresponding one of the pixels, based on the detection signal. The energy measurement unit measures energy of the light incident on a corresponding one of the pixels, based on the detection signal. The storage unit stores a measurement result in the timing measurement unit and the energy measurement unit. When viewed from a direction orthogonal to the first main surface, the light detection region and the signal processing region overlap each other at least at a part.

In the aspect, the light detection device includes the light detection substrate including the plurality of pixels which are two-dimensionally arranged. Each of the pixels includes a plurality of avalanche photodiodes arranged to operate in Geiger mode. Each of the signal processing units acquires a detection signal through the pad electrode of the pixels. Accordingly, in the light detection device, sensitivity of each of the pixels which are two-dimensionally arranged is improved. Accordingly, even in the case of detecting reflected light of light that is simultaneously projected to a two-dimensional range from a light source, accuracy and precision of detection are improved. In the light detection device, each of the signal processing units measures energy of light, based on the detection signal output from each of the pixels which includes the plurality of avalanche photodiodes in the energy measurement unit. Accordingly, the light detection device can distinguish reflected light from a target and disturbance light due to a difference in energy. Accordingly, an influence of the disturbance light can be reduced from the detection result. The circuit substrate is connected to the light detection substrate in a direction orthogonal to the first main surface, and the light detection region and the signal processing region overlap each other at least at a part. Accordingly, in a direction parallel to the first main surface, a reduction in size of the light detection device is achieved, and an electrical connection path between each of the pixels and each of the signal processing units is reduced. Each of the signal processing units includes a storage unit. In a case where the storage unit is provided at the outside of the signal processing unit, an interconnection from at least the timing measurement unit and the energy measurement unit is drawn to the outside from the signal processing unit, and thus a wide space is required between the signal processing units adjacent to each other. In a case where a wide space is required between the adjacent signal processing units, it is difficult to reduce the size of the light detection device. In the light detection device, since the storage unit is included in each of the signal processing units, the number of interconnections drawn from the signal processing unit to the outside of the signal processing unit is reduced. Accordingly, an additional reduction in size of the light detection device is achieved.

In the aspect, the light detection substrate may be surrounded by an edge of the circuit substrate when viewed from a direction orthogonal to the first main surface. In this case, an additional reduction in the size of the light detection device is achieved, and the electrical connection path between each of the pixel and each of the signal processing unit is further reduced.

In the aspect, the light detection region may include a first portion that overlaps the signal processing region and a second portion that does not overlap the signal processing region when viewed from a direction orthogonal to the first main surface. An area of the first portion may be greater than an area of the second portion. In this case, an additional reduction in the size of the light detection device is achieved, and the electrical connection path between each of the pixel and each of the signal processing unit is further reduced.

In the aspect, the signal processing region may include a third portion that does not overlap the light detection region when viewed from a direction orthogonal to the first main surface. The area of the first portion may be greater than the sum of the area of the second portion and an area of the third portion. In this case, an additional reduction in the size of the light detection device is achieved, and the electrical connection path between each of the pixel and each of the signal processing unit is further reduced.

In the aspect, a unit region where each of the pixels is provided in the light detection region and a unit region where one of the signal processing units which corresponds to the pixel in the signal processing region is provided may overlap each other at least at a part when viewed from a direction orthogonal to the first main surface. In this case, an additional reduction in the size of the light detection device is achieved, and the electrical connection path between each of the pixel and each of the signal processing unit is further reduced.

In the aspect, a center of balance of the pad electrode may deviate from a center of balance of a unit region where the signal processing unit to which the pad electrode is connected is provided toward the signal acquisition unit when viewed from a direction orthogonal to the first main surface. The center of balance of the pad electrode is a geometrical center. In this case, the electrical connection path between each of the pixels and each of the signal processing units is further reduced. When viewed from a direction orthogonal to the first main surface, an interconnection for applying a drive voltage to each of the signal processing units can be provided at the center of balance of the signal processing unit. Accordingly, routing of the interconnection is easy.

In the aspect, the unit region where each of the pixels is provided in the light detection region, and the unit region where one of the signal processing units which corresponds to the pixel in the signal processing region is provided may deviate from each other in a direction along the first main surface when viewed from a direction orthogonal to the first main surface, and may include portions which do not overlap each other. In this case, the electrical connection path between each of the pixels and each of the signal processing units can be further reduced.

In the aspect, the detection signal may be a current signal. The signal acquisition unit of each of the signal acquisition units may include a current-voltage conversion circuit and a signal transfer circuit. The current-voltage conversion circuit may convert the detection signal to a voltage. The signal transfer circuit may input a voltage signal output from the current-voltage conversion circuit to the energy measurement unit. The signal transfer circuit may include a Miller capacitor. The Miller capacitor may be connected to the energy measurement unit in parallel with the current-voltage conversion circuit. The energy measurement unit may measure energy of light incident on a corresponding one of the pixels, based on a waveform of a signal that is input from the signal transfer circuit. In this case, since the capacitor is included in the signal transfer circuit, the waveform becomes gentle due to the capacitor. When the waveform becomes gentle, precision in measurement of energy in the energy measurement unit can be improved. The waveform of the signal becomes gentle as electrical capacitance of the capacitor is greater. In the light detection device, the signal transfer circuit includes a Miller capacitor. Accordingly, the signal transfer circuit can obtain the same operation as in a case where a capacitor having larger electrical capacitance is used without enlarging a size of a capacitor region. As a result, the plurality of signal processing units can be formed in a compact manner in conformity to the plurality of pixels which are two-dimensionally arranged while securing precision in energy measurement.

In the aspect, the energy measurement unit may measure energy of light incident on a corresponding one of the pixels by measuring time for which a pulse height of a signal input from a corresponding signal acquisition unit corresponding to the signal acquisition unit is equal to or greater than a threshold value. The energy measurement unit can be realized by simple digital processing, and can be physically configured in a compact manner. Accordingly, a size of a region of the energy measurement unit is reduced. As a result, the plurality of signal processing units can be formed in a compact manner in conformity to the plurality of pixels which are two-dimensionally arranged.

In the aspect, the storage unit of each of the signal processing unit may include a plurality of storage regions. The plurality of storage regions respectively store measurement results in the timing measurement unit and the energy measurement unit with respect to incident light that is incident on a corresponding one of the pixels at timings different from each other in a predetermined measurement period. Since the light detection device includes the plurality of storage regions, even when measurement results for disturbance light incident on the pixel are output from the timing measurement unit and the energy measurement unit in the predetermined measurement period, a measurement result for reflection light from a target is also stored. In the light detection device, the plurality of storage regions are included in each of the signal processing units. Accordingly, an influence of the disturbance light is reduced, and the number of interconnections drawn from the signal processing unit to the outside of the signal processing unit is reduced.

Advantageous Effects of Invention

The aspect of the invention provides a light detection device which has a compact configuration and in which accuracy and precision of detection are improved even in the case of being used in a flash type measurement device.

DESCRIPTION OF EMBODIMENTS

Figure 1:
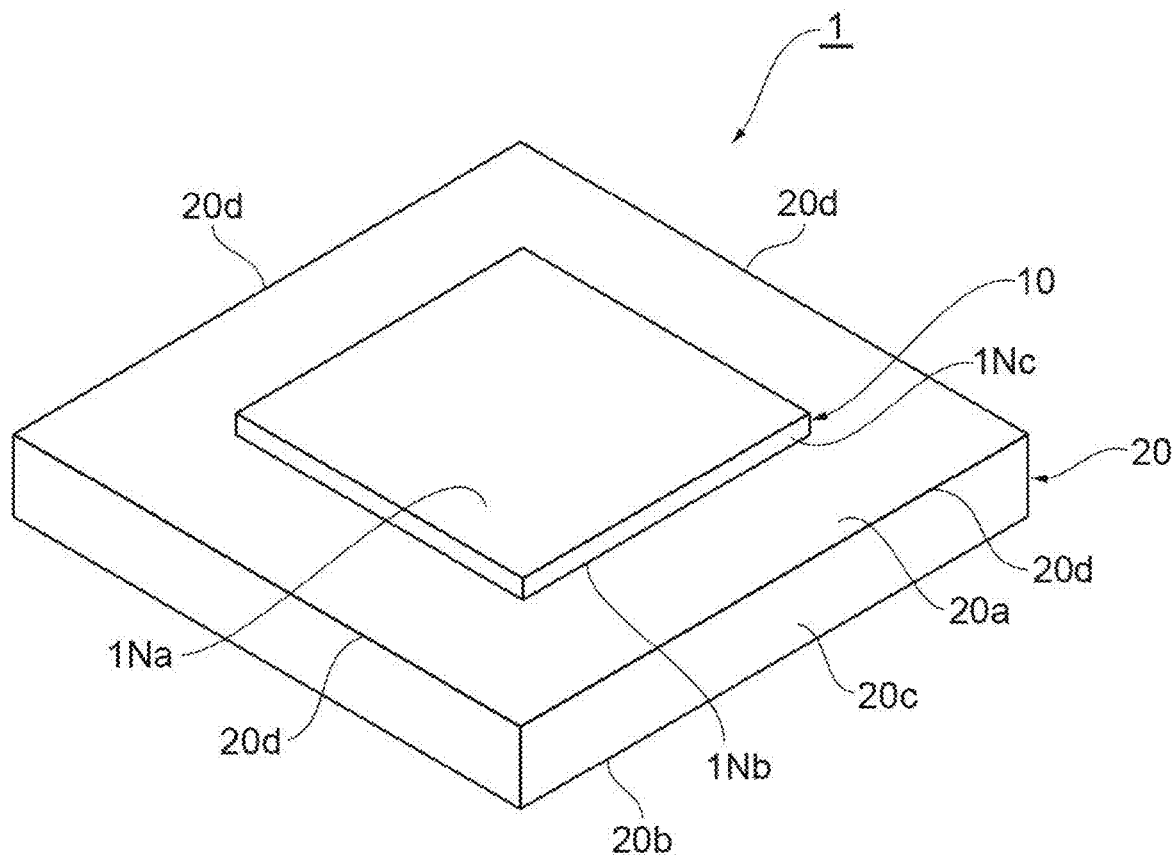
FIG. 1 is a schematic perspective view illustrating a light detection device according to an embodiment.

Hereinafter, an embodiment of the invention will be described in detail with reference to the accompanying drawings. Note that, in the description, the same reference numeral will be given to the same element or an element having the same function, and redundant description thereof will be omitted.

Figure 2:
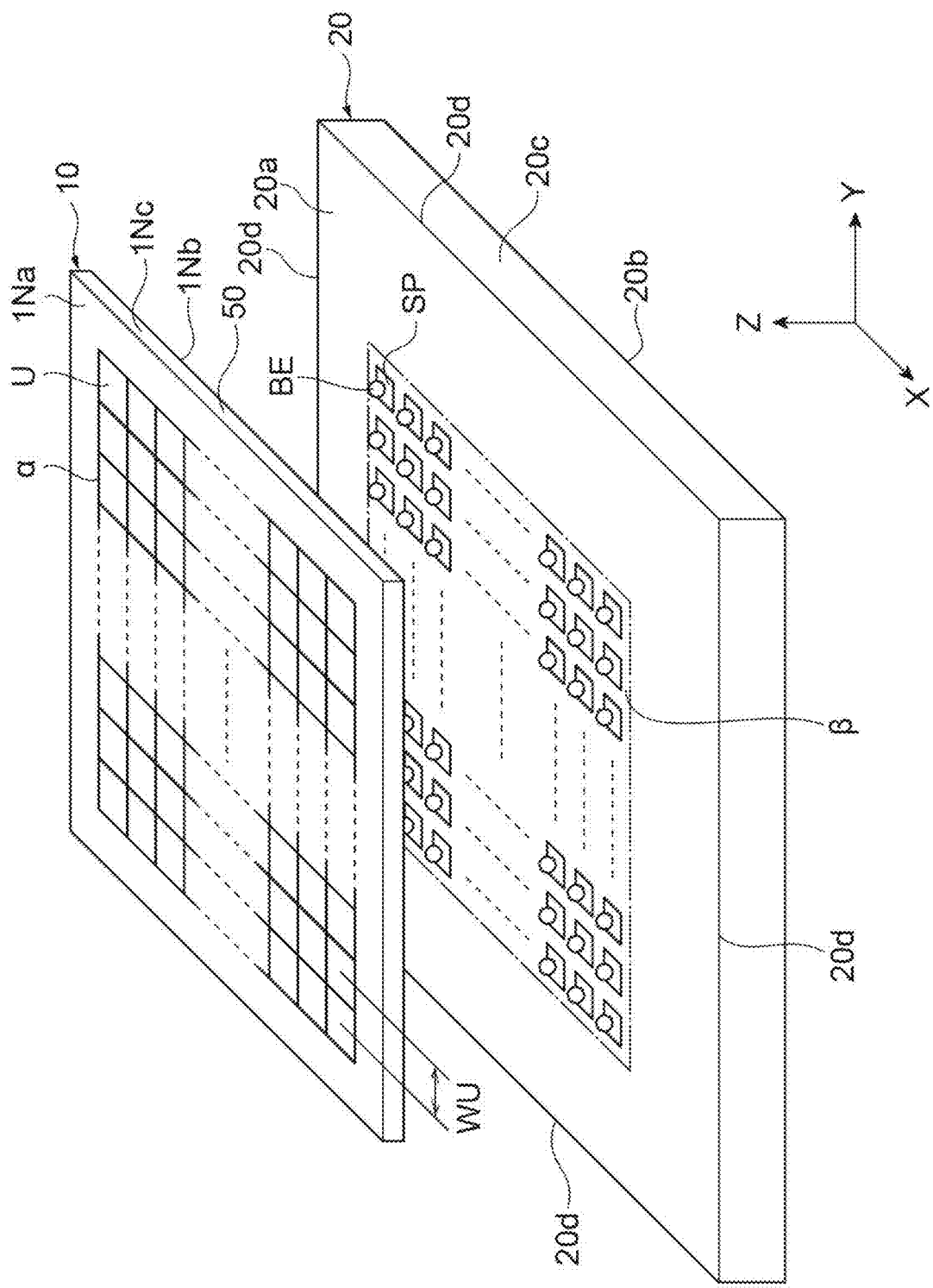
FIG. 2 is an exploded perspective view of the light detection device.

First, a configuration of a light detection device according to this embodiment will be described with reference to FIG. 1 and FIG. 2. FIG. 1 is a schematic perspective view illustrating the light detection device according to this embodiment. FIG. 2 is an exploded perspective view of the light detection device illustrated in FIG. 1. A light detection device 1 is a semiconductor light detection device.

As illustrated in FIG. 1 and FIG. 2, the light detection device 1 includes a light detection substrate 10 and a circuit substrate 20. The light detection substrate 10 and the circuit substrate 20 face each other. In this embodiment, a surface parallel to each main surface of the light detection substrate 10 and the circuit substrate 20 is an XY-axis plane, and a direction orthogonal to the main surface is a Z-axis direction.

The light detection substrate 10 includes a semiconductor substrate 50 having a rectangular shape in a plan view. In this embodiment, the light detection substrate 10 is a light detection substrate that is used in a so-called rear-surface incident type semiconductor light detection device. The semiconductor substrate 50 is a P-type semiconductor substrate formed of Si. The semiconductor substrate 50 includes a main surface 1Na and a main surface 1Nb opposite to each other. A P-type is an example of a first conductive type. An N-type is an example of a second conductive type. The main surface 1Na is a light incident surface to the semiconductor substrate 50. In a case where the main surface 1Na is a first main surface, the main surface 1Nb is a second main surface.

The circuit substrate 20 includes a main surface 20a and a main surface 20b opposite to each other. The circuit substrate 20 has a rectangular shape in a plan view. The light detection substrate 10 is connected to the circuit substrate 20 in the Z-axis direction. The main surface 20a and the main surface 1Nb face each other.

A side surface 20c of the circuit substrate 20 is located on an outer side in comparison to a side surface 1Nc of the semiconductor substrate 50 in an XY-axis plane direction. In a plan view, an area of the circuit substrate 20 is greater than an area of the semiconductor substrate 50. In other words, the side surface 20c of the circuit substrate 20 is located on an outer side in comparison to the side surface 1Nc of the semiconductor substrate 50 in the XY-axis plane direction. When viewed from the Z-axis direction, the light detection substrate 10 is surrounded by an edge 20d of the circuit substrate 20. The side surface 20c of the circuit substrate 20 and the side surface 1Nc of the semiconductor substrate 50 may be flush with each other.

The light detection substrate 10 is mounted on the circuit substrate 20. The light detection substrate 10 and the circuit substrate 20 are connected to each other by a bump electrode BE. The light detection substrate 10 is disposed at the center of the circuit substrate 20 when viewed from the Z-axis direction. As illustrated in FIG. 2, the light detection substrate 10 includes a plurality of pixels U. The plurality of pixels U are two-dimensionally arranged in a matrix shape in a light detection region α of the light detection substrate 10 when viewed from the Z-axis direction. The light detection region α has a rectangular shape when viewed from the Z-axis direction. The light detection device 1 outputs a detection signal corresponding to light detected by the plurality of pixels U. A pitch WU between the pixels U is 10 μm to 500 μm in a row direction and a column direction. In this embodiment, the pitch WU is 100 μm. The row direction is an X-axis direction, and the column direction is a Y-axis direction.

For example, the circuit substrate 20 constitutes an application specific integrated circuit (ASIC). As illustrated in FIG. 2, the circuit substrate 20 includes a plurality of signal processing units SP. Each of the signal processing units SP processes a detection signal output from a corresponding one of the pixels U. The plurality of signal processing units SP are two-dimensionally arranged in a signal processing region β of the circuit substrate 20 when viewed from the Z-axis direction. Each of the signal processing units SP is electrically connected to the light detection substrate 10 through the bump electrode BE. In this embodiment, the signal processing units SP are arranged in the same pitch WU as in corresponding pixels U of the pixels U.

Figure 3:
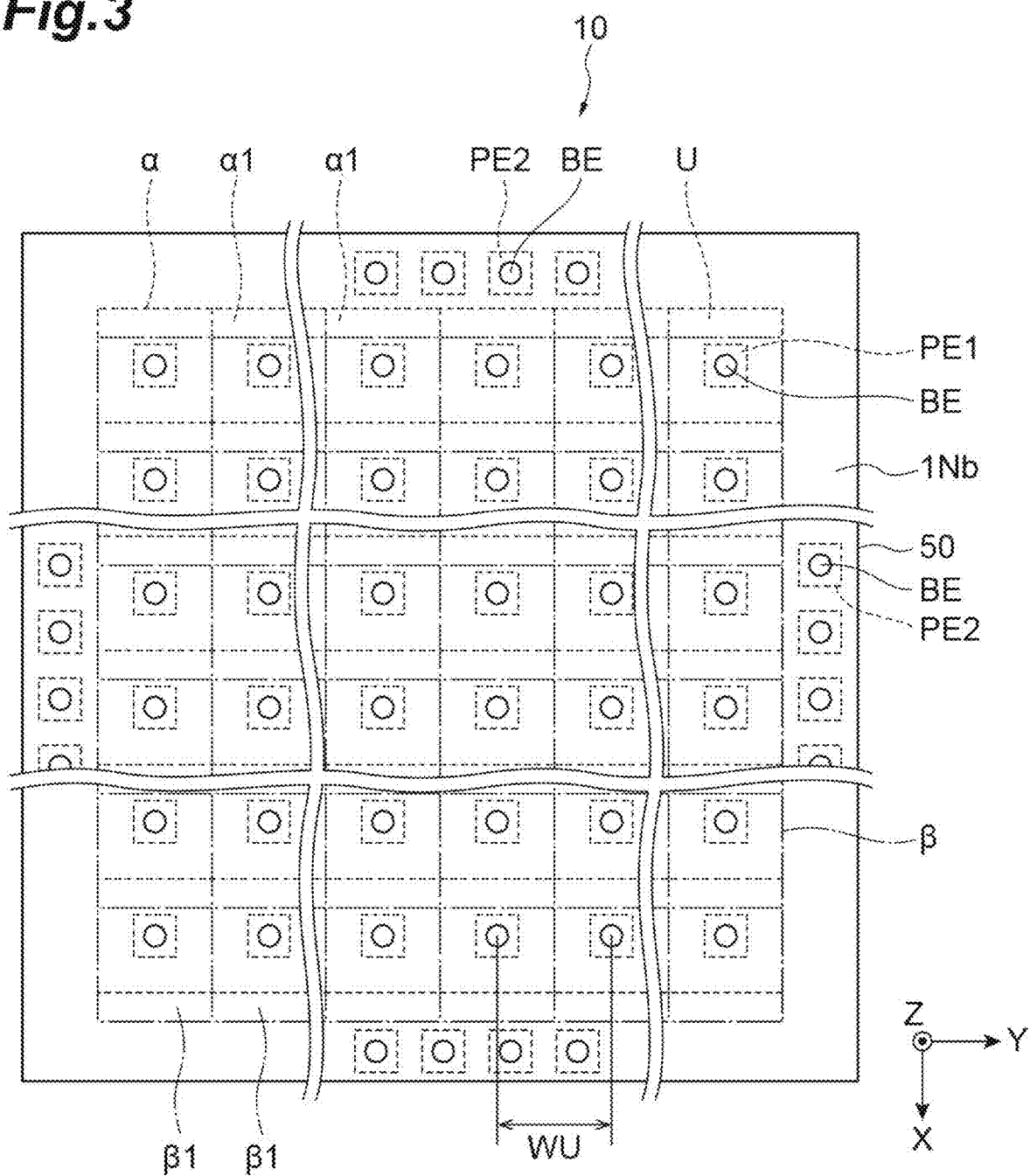
FIG. 3 is a schematic plan view of a light detection substrate.
Figure 4:
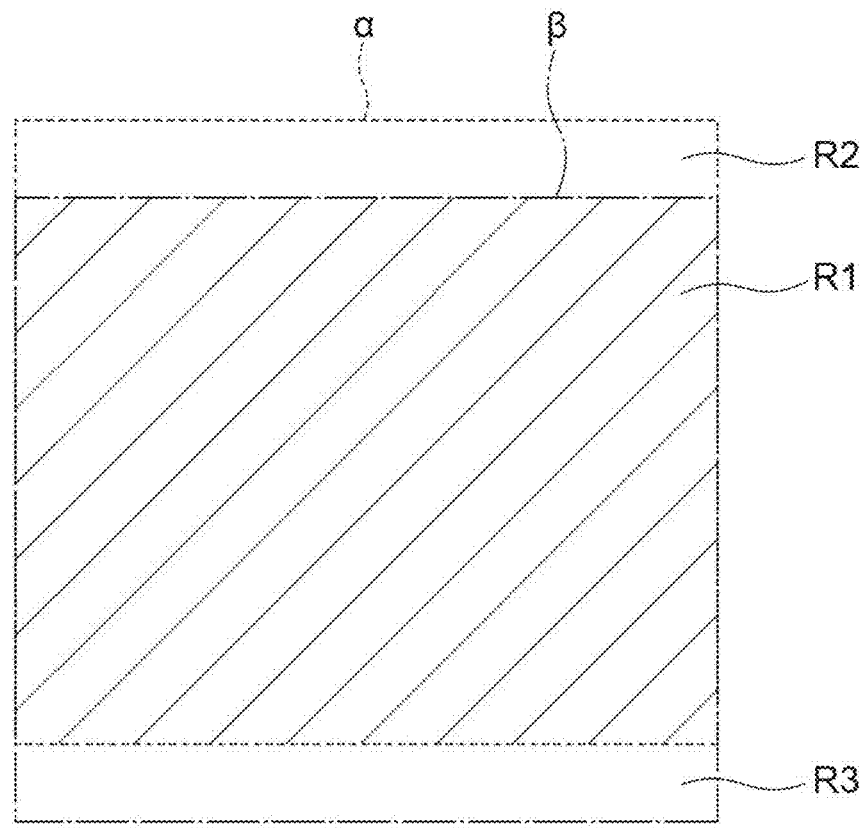
FIG. 4 is a schematic view illustrating a positional relationship between a light detection region and a signal processing region.
Figure 5:
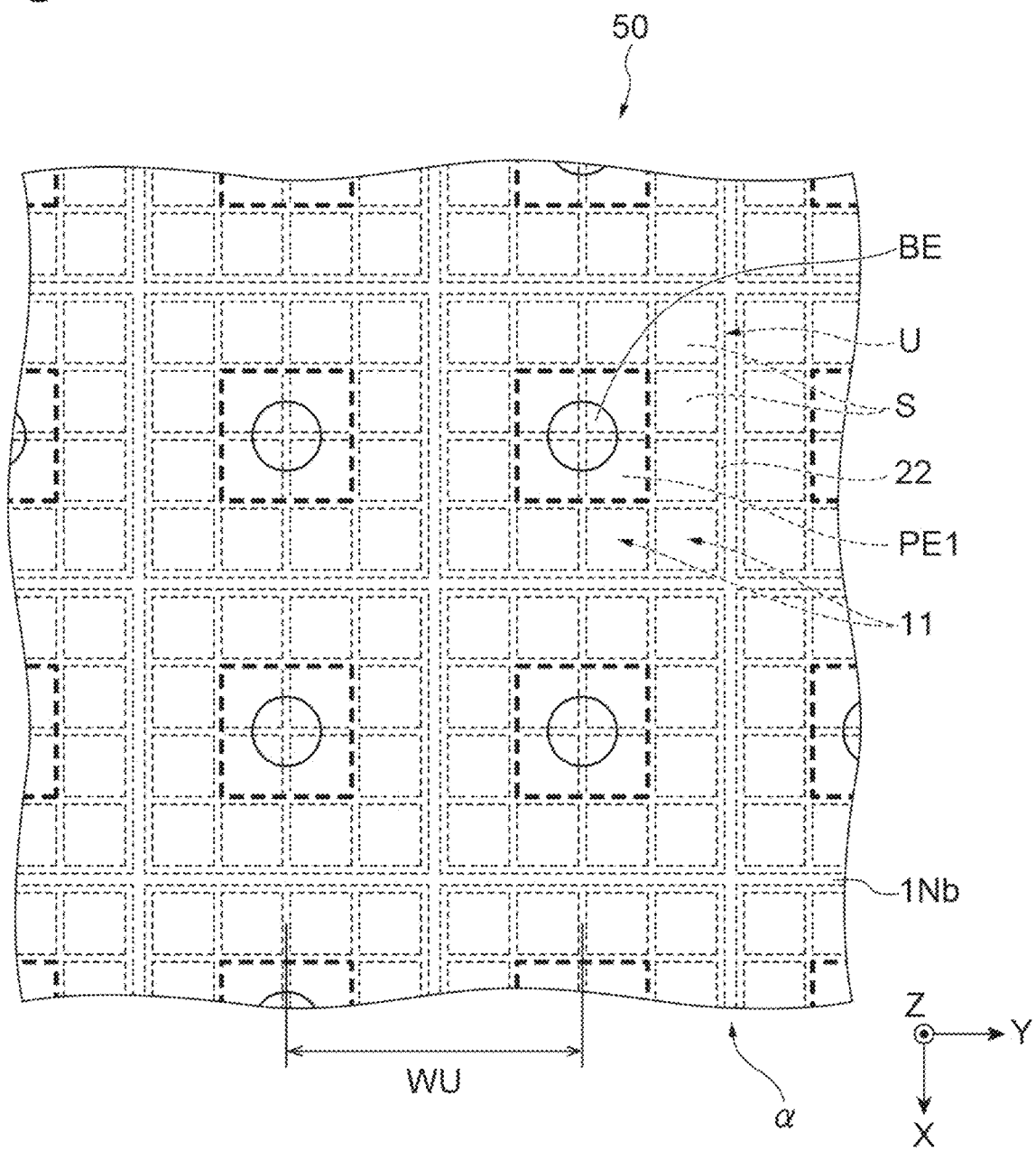
FIG. 5 is a schematic enlarged view of the light detection substrate.
Figure 6:
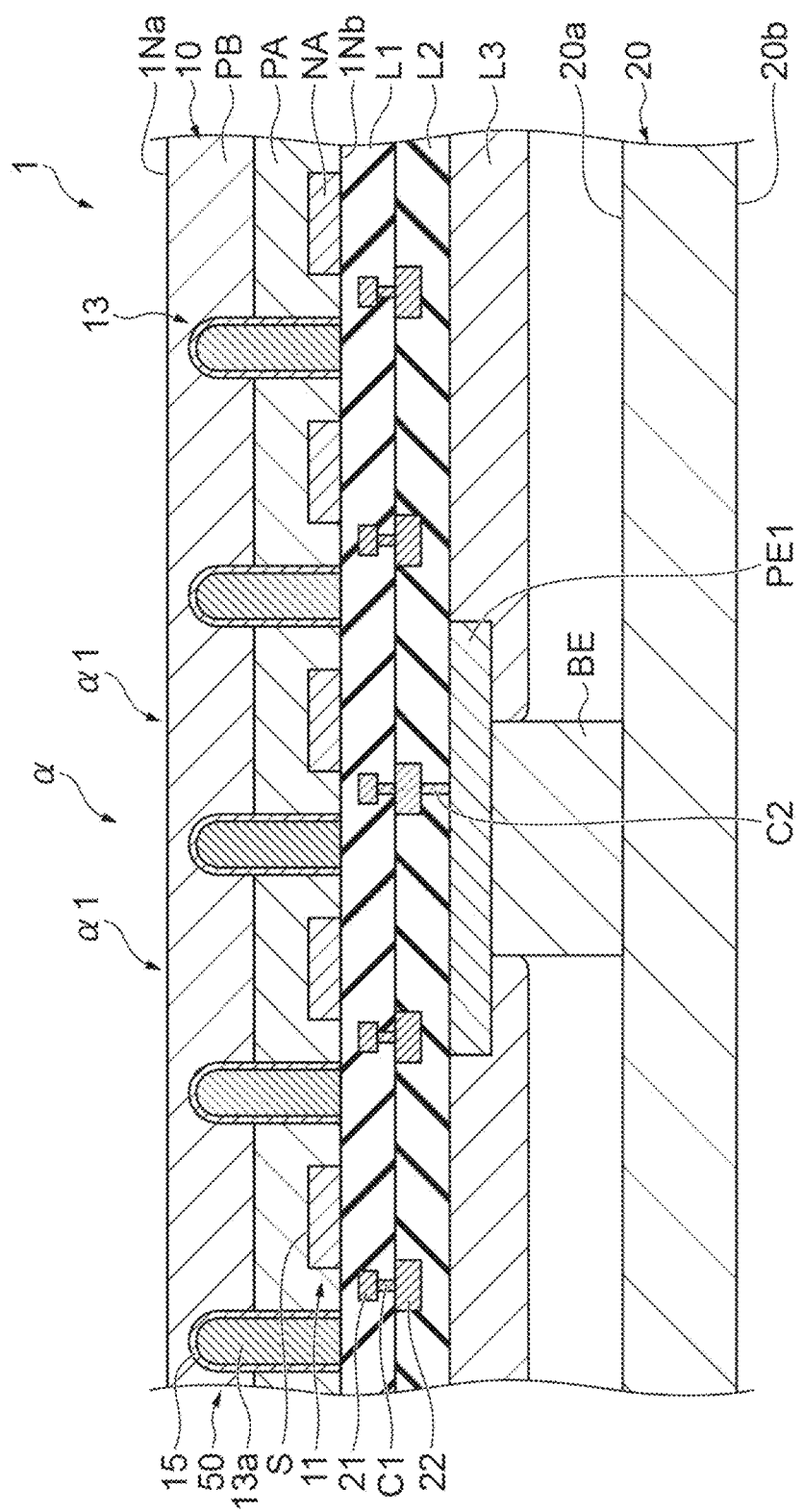
FIG. 6 is a view illustrating a cross-sectional configuration of the light detection device.

Next, a configuration of the light detection substrate 10 will be described with reference to FIG. 3 to FIG. 6. FIG. 3 is a view illustrating the main surface 1Nb of the light detection substrate 10 when viewed from the Z-axis direction. FIG. 4 is a schematic view illustrating a positional relationship between the light detection region α and the signal processing region β. FIG. 5 illustrates a region provided with a pad electrode PE1 and a bump electrode BE are provided in correspondence with each of the pixels U. FIG. 6 illustrates a cross-sectional configuration of the light detection device.

In FIG. 3, a position of the signal processing unit SP when viewing the light detection device 1 from the Z-axis direction is indicated by a one-dot chain line. FIG. 3 illustrates a positional relationship between each of the pixels U, the bump electrode BE, and the signal processing unit SP of the circuit substrate 20. As illustrated in FIG. 3, when viewed from the Z-axis direction, the light detection region α and the signal processing region β overlap each other at least at a part. In this embodiment, when viewed from the Z-axis direction, the light detection region α and the signal processing region β deviate from each other in the X-axis direction.

FIG. 4 illustrates a positional relationship between the light detection region α and the signal processing region β when viewed from the Z-axis direction. The light detection region α includes a portion R1 that overlaps the signal processing region β and a portion R2 that does not overlap the signal processing region β when viewed from the Z-axis direction. The signal processing region β includes the portion R1 that overlaps the light detection region α and a portion R3 that does not overlap the light detection region α when viewed from the Z-axis direction. In other words, the portion R1 is a portion where the light detection region α and the signal processing region β overlap each other when viewed from the Z-axis direction. The portion R2 is a portion where the light detection region α and the signal processing region β do not overlap each other in the light detection region α when viewed from the Z-axis direction. The portion R3 is a portion where the light detection region α and the signal processing region β do not overlap each other in the signal processing region β when viewed from the Z-axis direction. In FIG. 4, the portion R1 is hatched. When viewed from the Z-axis direction, an area of the portion R1 is greater than an area of the portion R2. When viewed from the Z-axis direction, the area of the portion R1 is greater than the sum of the area of the portion R2 and an area of the portion R3. For example, the portion R1 is a first portion, the portion R2 is a second portion, and the portion R3 is a third portion.

The light detection region α includes a plurality of unit regions α1 where a plurality of pixels U are provided, respectively. One pixel U is provided in one unit region α1. The signal processing region β includes a plurality of unit regions β1 where a plurality of signal processing units SP are provided, respectively. One signal processing unit SP is provided in one unit region β1. When viewed from the Z-axis direction, the unit region α1 where each of the pixels U is provided and the unit region β1 where the signal processing unit SP corresponding to the pixel U is provided overlap each other at least at a part. When viewed from the Z-axis direction, the unit region α1 where each of the pixels U is provided and the unit region β1 where the signal processing unit SP corresponding to the pixel U is provided deviate from each other in a direction along the main surface 1Na and include portions which do not overlap each other. In this embodiment, the unit region β1 where the corresponding signal processing unit SP is provided deviates from the unit region α1 where the pixel U is provided in the X-axis direction.

As illustrated in FIG. 3 and FIG. 5, the light detection substrate 10 includes a plurality of avalanche photodiodes 11 operating in Geiger mode, a plurality of quenching resistors 21, and pad electrodes PE1 and PE2. Hereinafter, "avalanche photodiode" is referred to as "APD".

The light detection substrate 10 is provided with the plurality of APDs 11 operating in Geiger mode, the plurality of quenching resistors 21, and at least one pad electrode PE1 for every pixel U. In this embodiment, one pad electrode PE1 is provided for every pixel U. The signal processing unit SP is connected to only one pad electrode PE1. One of the plurality of signal processing units SP is connected to only one pixel U through a corresponding pad electrode PE1. In other words, the plurality of signal processing units SP and the plurality of pixels U are connected to correspond in a one-to-one relationship.

The plurality of APDs 11 are two-dimensionally arranged in the semiconductor substrate 50. Each of the APDs 11 includes a light-receiving region S that receives light incident from the main surface 1Na side. A plurality of the light-receiving regions S are provided on the main surface 1Nb side of the semiconductor substrate 50. As illustrated in FIG. 5, in the light detection substrate 10, each of the pixels U includes the plurality of light-receiving regions S. The plurality of light-receiving regions S are two-dimensionally arranged for every pixel U when viewed from the Z-axis direction. Each of the light-receiving regions S is a charge generation region where charges occur in correspondence with incident light. The light-receiving region S is a light sensitive region. In this embodiment, as illustrated in FIG. 5, the light-receiving region S has a rectangular shape when viewed from the Z-axis direction.

As illustrated in FIG. 6, the light detection substrate 10 includes the plurality of quenching resistors 21 and an electrode 22 for every pixel U. Each of the quenching resistors 21 is disposed on the main surface 1Nb side of the semiconductor substrate 50. The quenching resistor 21 extends along an outer edge of the light-receiving region S when viewed from the Z-axis direction. Each of the quenching resistors 21 is electrically connected to the light-receiving region S of a corresponding one among the APDs 11 in series. The quenching resistor 21 constitutes a passive quenching circuit.

As illustrated in FIG. 5, the electrode 22 is provided in a lattice shape to pass between the plurality of light-receiving regions S included in one pixel U when viewed from the Z-axis direction on the main surface 1Nb side. The light-receiving regions S are surrounded by the electrode 22 when viewed from the Z-axis direction. The electrode 22 is electrically connected to all of the light-receiving regions S included in one pixel U through the plurality of quenching resistors 21. The electrode 22 is electrically connected to the light-receiving region S corresponding to each of the quenching resistors 21 through the plurality of quenching resistors 21. The electrode 22 is connected to the pad electrode PE1 corresponding to the pixel U. In this embodiment, the electrode 22 is connected to the pad electrode PE1 located at the center of a corresponding pixel U. According to the configuration, all of the quenching resistors 21 included in one pixel U are electrically connected to one pad electrode PE1 in parallel by the electrode 22. That is, each pad electrode PE1 is electrically connected to the plurality of APDs 11 included in a corresponding pixel U through the quenching resistors 21 and the electrode 22.

The plurality of pad electrodes PE1 are located in the light detection region $\alpha$ where the plurality of pixels U are two-dimensionally arranged when viewed from the Z-axis direction. Each of the pad electrodes PE1 is disposed on the main surface 1Nb side to overlap at least one APD 11 among the plurality of APDs 11 provided in a corresponding pixel U when viewed from the Z-axis direction. In this embodiment, the pad electrode PE1 has a rectangular shape, and is disposed to overlap four APDs 11 located at the center of the pixel U among sixteen APDs 11 provided in one pixel U. The bump electrode BE is disposed at the center of the pad electrode PE1 when viewed from the Z-axis direction. In this embodiment, the pad electrode PE1 is in contact with the electrode 22 surrounding four light-receiving regions S located at the center of the pixel U when viewed from the Z-axis direction.

As a modification example of this embodiment, the pad electrode PE1 may be in contact with all of the plurality of APDs 11 provided in the pixel U. In this case, for example, the pad electrode PE1 may be disposed on the main surface 1Nb side to overlap all of the plurality of APDs 11 provided in the pixel U when viewed from the Z-axis direction.

As illustrated in FIG. 3, on the main surface 1Nb side, the pad electrode PE2 is disposed to be spaced apart from the light detection region $\alpha$ where the plurality of pixels U are arranged. The pad electrode PE2 is a common electrode configured to apply a voltage to each of the APDs 11 from the main surface 1Na side. In this embodiment, the pad electrode PE2 has a rectangular shape, and is disposed at four sides of the main surface 1Nb. The bump electrode BE is also disposed at the pad electrode PE2.

As illustrated in FIG. 6, each of the APDs 11 includes a P-type first semiconductor region PA, a P-type second semiconductor region PB, and an N-type third semiconductor region NA. The first semiconductor region PA is located on the main surface 1Nb side of the semiconductor substrate 50. The second semiconductor region PB is located on the main surface 1Na side of the semiconductor substrate 50. The third semiconductor region NA is formed within the first semiconductor region PA. A concentration of impurities in the second semiconductor region PB is higher than a concentration of impurities in the first semiconductor region PA. The light-receiving region S is formed by the first semiconductor region PA and the third semiconductor region NA. Each of the APDs 11 is configured by a $P^+$ layer that is the second semiconductor region PB, a $P^-$ layer that is the first semiconductor region PA, and an $N^+$ layer that is the third semiconductor region NA in this order from the main surface 1Na side.

A groove 13 is formed in the semiconductor substrate 50 to surround the third semiconductor region NA. In this embodiment, the light detection region $\alpha$ is surrounded by the groove 13 when viewed from the Z-axis direction. The light detection region $\alpha$ is defined by an inner wall of the groove 13 that surrounds the light detection region a. When viewed from the Z-axis direction, an outer edge of the light detection region $\alpha$ matches an inner wall of the groove 13, which is located on an outermost side of the light detection device 1, and the inner wall is closest to the pixel U. The unit region $\alpha 1$ is surrounded by the groove 13 when viewed from the Z-axis direction. The unit region $\alpha 1$ is defined by an inner wall of the groove 13 that surrounds the unit region $\alpha 1$. When viewed from the Z-axis direction, an outer edge of the unit region $\alpha 1$ matches an inner wall of the groove 13, which surrounds the pixel U within the unit region $\alpha 1$, and the inner wall is closest to the pixel U.

The groove 13 passes through the first semiconductor region PA in the Z-axis direction and reaches the second semiconductor region PB. A core material 13*a* is disposed in the groove 13. The core material 13*a* is formed of a high-melting-point metal. For example, the core material 13*a* is formed of tungsten. A surface of the groove 13 is constituted by a P-type semiconductor layer 15 in which a concentration of impurities is higher in comparison to the first semiconductor region PA. That is, the core material 13*a* is covered with the semiconductor layer 15 at the inside of the semiconductor substrate 50. As a modification example of this embodiment, the groove 13 may extend in the first semiconductor region PA in the Z-axis direction, and may not reach the second semiconductor region PB.

An insulating layer L1 is disposed on the first semiconductor region PA, the third semiconductor region NA, and the groove 13. The quenching resistor 21 is covered with the insulating layer L1. The electrode 22 is disposed on the insulating layer L1, and is covered with an insulating layer L2. The pad electrode PE1 is disposed on the insulating layer L2. The insulating layer L2 is covered with the pad electrode PE1 and a passivation layer L3. The passivation layer L3 also covers a part of the pad electrode PE1.

The above-described quenching resistor 21 is connected to the third semiconductor region NA through an electrode (not illustrated). The quenching resistor 21 is connected to a corresponding electrode 22 through a connection portion C1. The electrode 22 is connected to a corresponding pad electrode PE1 through a connection portion C2. The pad electrode PE1 is connected to the bump electrode BE at a portion exposed from the passivation layer L3.

The electrode 22, the pad electrodes PE1 and PE2, the connection portion C1, and the connection portion C2 are formed of a metal. For example, electrode 22, the pad electrodes PE1 and PE2, the connection portion C1, and the connection portion C2 are formed of aluminum (Al). In a case where the semiconductor substrate 50 is formed of Si, as an electrode material, for example, copper (Cu) is used in addition to aluminum. The electrode 22, the pad electrode PE1, the connection portion C1, and the connection portion C2 may be integrally formed. For example, the electrode 22, the pad electrode PE1, the connection portion C1, and the connection portion C2 are formed by a sputtering method.

In a case where Si is used as the material of the semiconductor substrate 50, elements of Group III are used as P-type impurities, and elements of Group V are used as N-type impurities. Examples of the elements of Group III as the P-type impurities include B. Examples of the elements of Group V as the N-type impurities include P or As. An element in which an N-type and a P-type which are conductive types of a semiconductor are substituted with each other also functions as the light detection device as in the light detection substrate 10. As a method of adding the impurities, for example, a diffusion method or an ion injection method is used.

For example, the insulating layers L1 and L2, and the passivation layer L3 are formed of $SiO_2$, SiN, or a resin. As a method of forming the insulating layers L1 and L2, and the passivation layer L3, a thermal oxidation method, a sputtering method, a CVD method, or a resin coating method is used.

The circuit substrate 20 is electrically connected to the pad electrode PE1 by the bump electrode BE. Each of the signal processing unit SP includes an electrode that is disposed in correspondence with the pad electrode PE1, and the electrode is electrically connected to a corresponding pad electrode PE1 through the bump electrode BE. A detection signal output from the plurality of APDs 11 included in the pixel U is guided to a corresponding signal processing unit SP through the quenching resistor 21, the electrode 22, the pad electrode PE1, and the bump electrode BE.

The bump electrode BE is formed in the pad electrode PE1 through an under bump metal (UBM) (not illustrated). The UBM is formed of a material of which electrical and physical connection with the bump electrode BE is excellent. For example, the UBM is formed by an electroless plating method. For example, the bump electrode BE is formed by method of mounting a soldering ball, a printing method, or electrolytic plating. For example, the bump electrode BE is formed of copper, solder, or indium.

Figure 7:
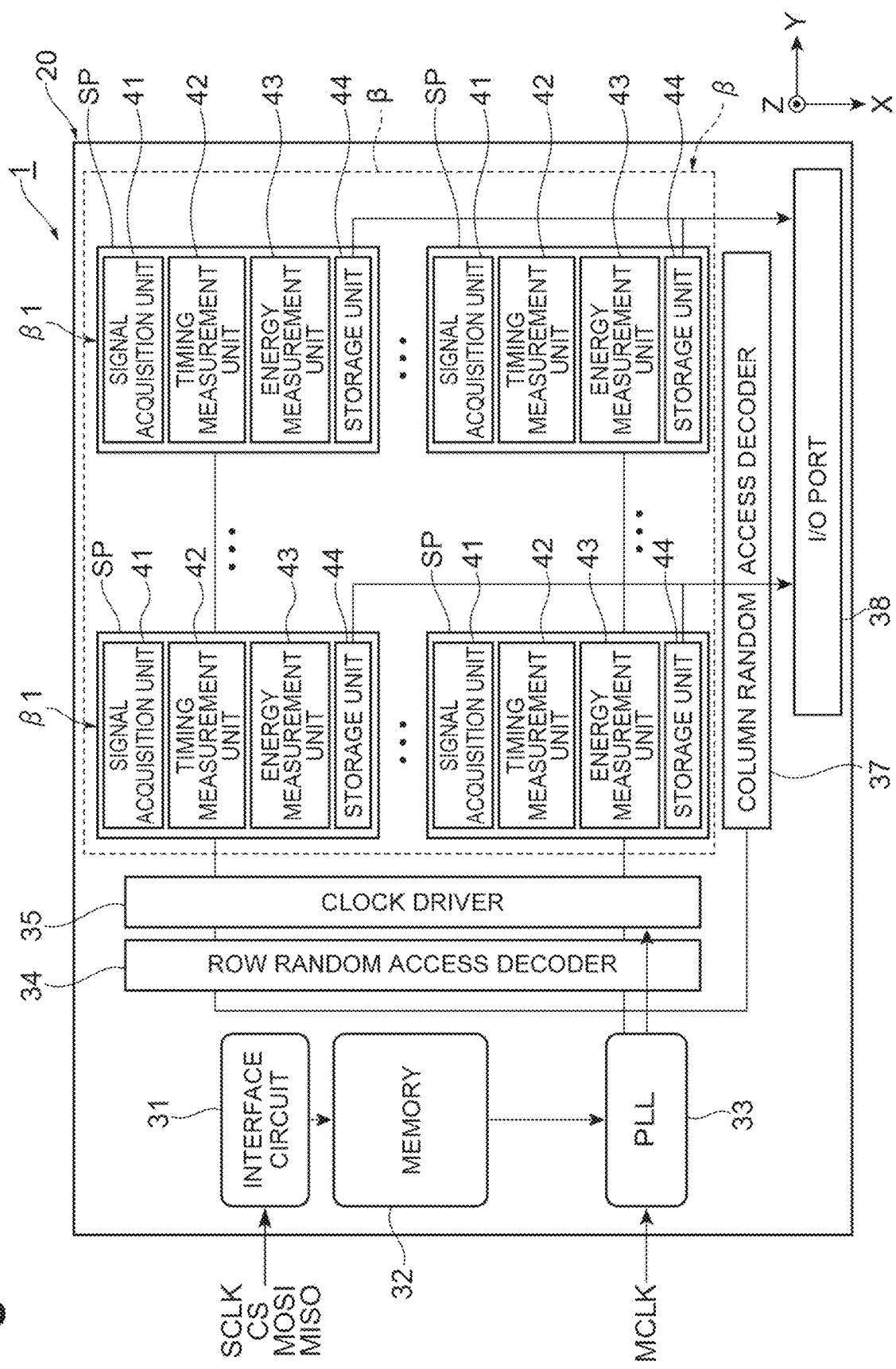
FIG. 7 is a view illustrating a configuration of a circuit substrate.

Next, a configuration of a circuit substrate according to this embodiment will be described with reference to FIG. 7. FIG. 7 is a view illustrating a configuration of the circuit substrate 20. As illustrated in FIG. 7, the circuit substrate 20 includes an interface circuit 31, a memory 32, a phase locked loop (PLL) 33, a row random access decoder 34, a clock driver 35, a column random access decoder 37, and an I/O port 38 in addition to the plurality of signal processing units SP. The PLL 33 and the clock driver 35 are disposed in a region that does not overlap the light detection region α when viewed from the Z-axis direction.

For example, the interface circuit 31 corresponds to a serial peripheral interface (SPI) bus. The interface circuit 31 receives a digital signal such as serial clock (SLCK), chip select (CS), master output/slave input (MOSI), and master input/slave output (MISO) which are input from the outside, and stores resistor setting information included in the signal in the memory 32.

The PLL 33 generates a clock signal, based on master clock (MCLK) input from the outside and data stored in the memory 32, and transmits the generated clock signal to the clock driver 35. The PLL 33 includes a programmable frequency divider and sets the number of frequency division with reference to the data stored in the memory 32. In correspondence with an input to the interface circuit 31 from the outside, the number of frequency division of the PLL 33 may be set to an arbitrary value. The PLL 33 outputs a control voltage for controlling each of the signal processing units SP in combination with a clock signal.

The clock driver 35 supplies a clock signal to each of the signal processing units SP. The plurality of signal processing units SP are electrically connected to the plurality of APDs 11 included in a corresponding pixel U, respectively, through the bump electrode BE. A detection signal output from the corresponding pixel U is input to the signal processing unit SP. The detection signal transmitted from the pixel U is a pulse signal having an analog waveform. The signal processing unit SP calculates pixel data such as incident timing and energy of incident light on a corresponding pixel U and pixel, based on the detection signal that is input. The pixel data calculated by the signal processing unit SP is output to the I/O port 38 at timing corresponding to a signal transmitted from the row random access decoder 34 and the column random access decoder 37.

The signal processing unit SP includes a signal acquisition unit 41, a timing measurement unit 42, an energy measurement unit 43, and a storage unit 44. The signal acquisition unit 41 acquires the detection signal that is output from the pixel U through a corresponding pad electrode PE1. The signal acquisition unit 41 includes a front end circuit. The timing measurement unit 42 measures timing at which light is incident on a corresponding pixel U, based on the detection signal. The energy measurement unit 43 measures energy of light incident on a corresponding pixel U, based on the detection signal. In this embodiment, the energy measurement unit 43 performs measurement by converting energy of light incident on a corresponding pixel U into time. For example, the energy measurement unit 43 measures time for which a pulse height of a signal input from a corresponding signal acquisition unit 41 is equal to or greater than a threshold value as the energy by using a time-over threshold (TOT) circuit. The storage unit 44 stores measurement results in the timing measurement unit 42 and the energy measurement unit 43.

Figure 8:
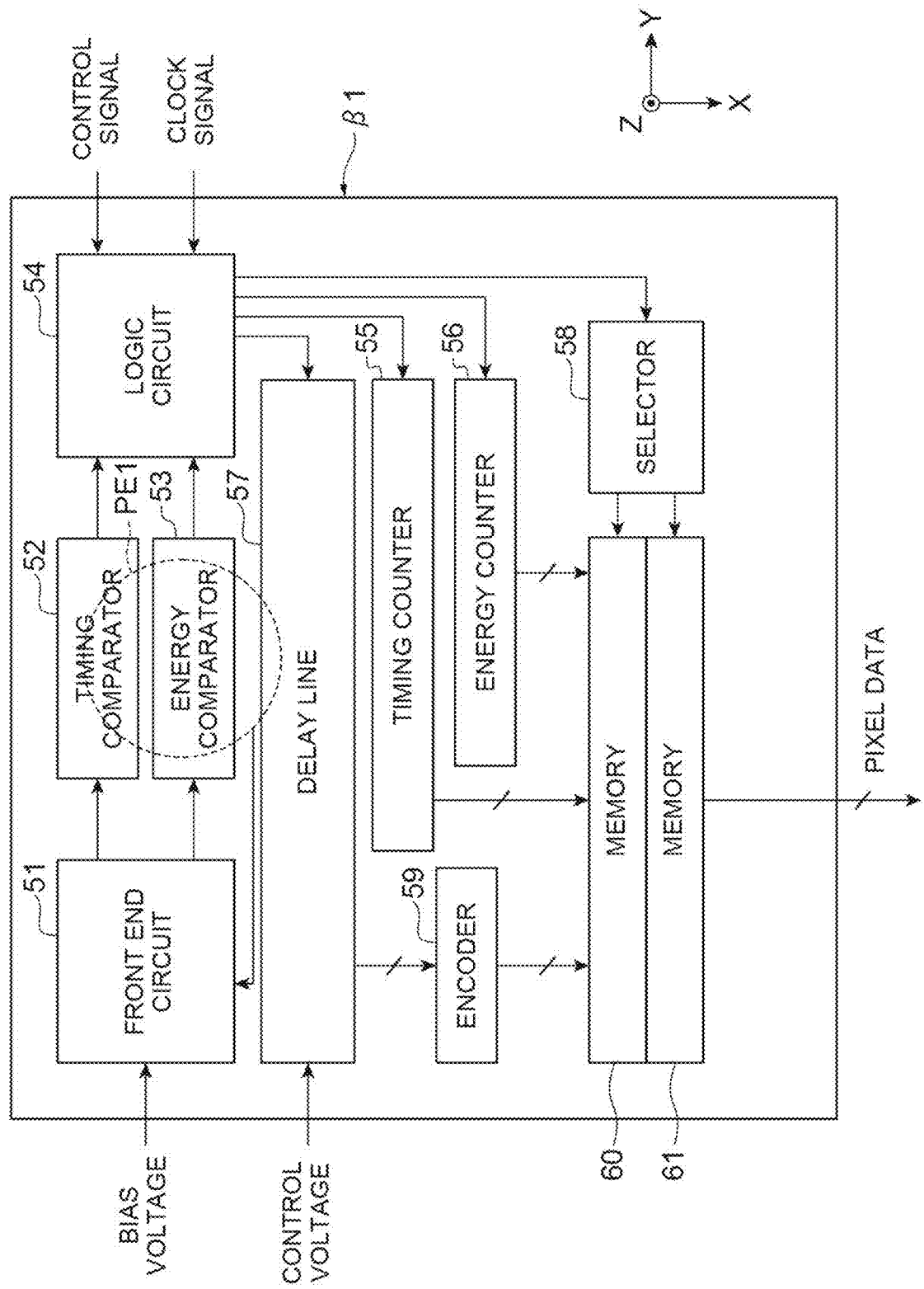
FIG. 8 is a view illustrating a configuration of a signal processing unit.
Figure 9:
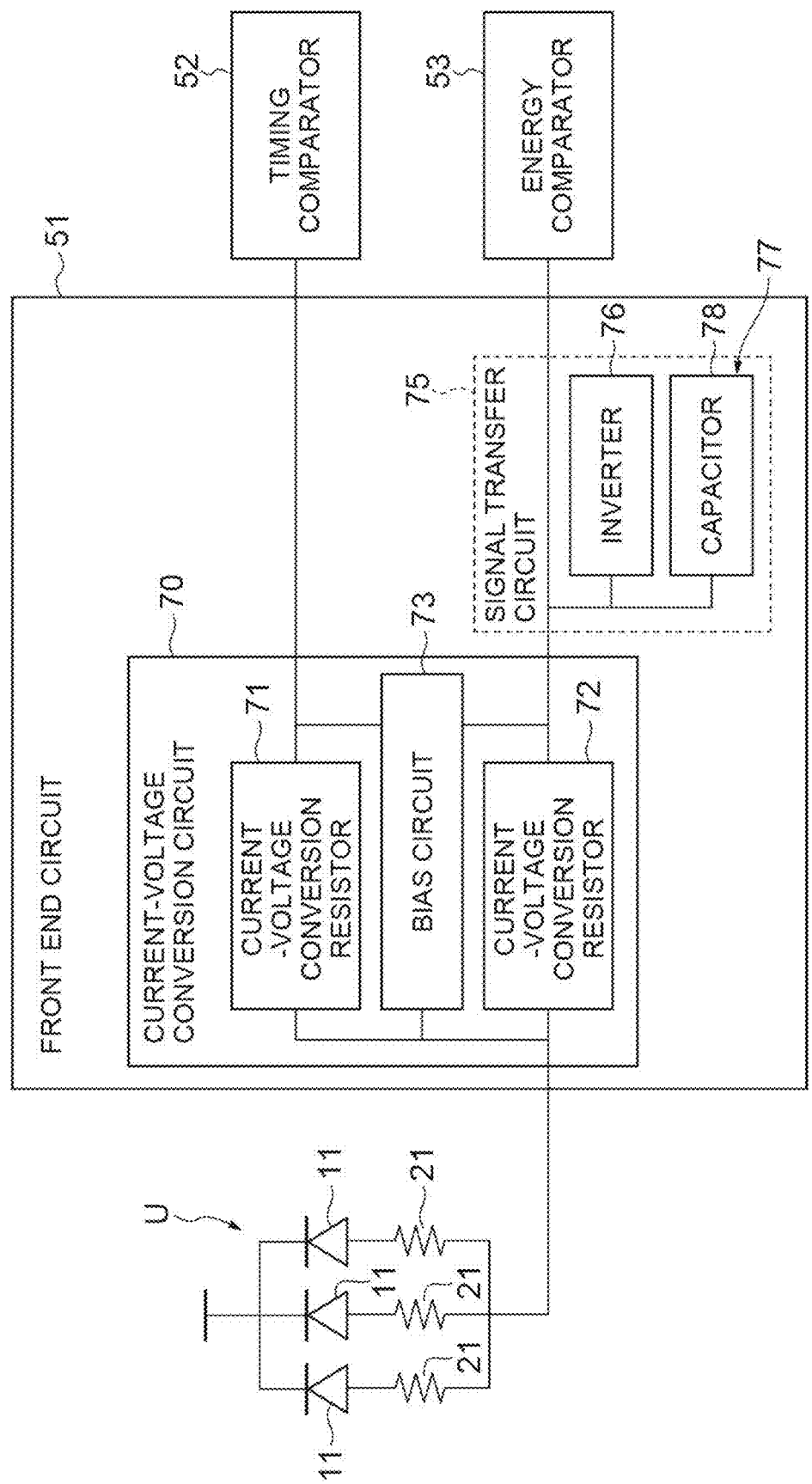
FIG. 9 is a view illustrating a configuration of a front end circuit.
Figure 10:
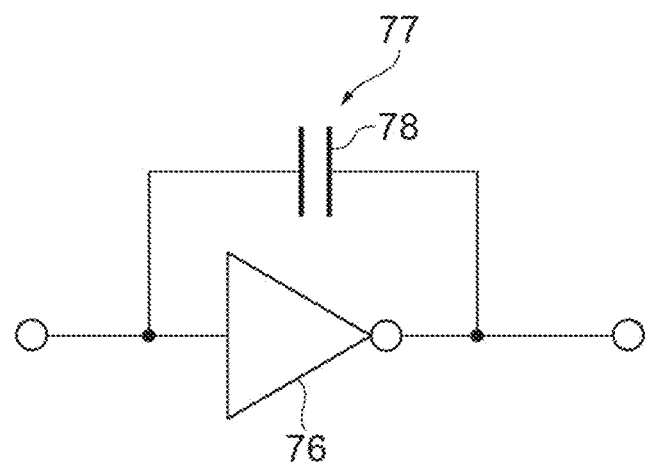
FIG. 10 is a view illustrating a Miller capacitor.

Next, an example of a configuration of each of the signal processing units SP will be described in detail with reference to FIG. 8 to FIG. 10. FIG. 8 illustrates a configuration of the signal processing unit SP in this embodiment.

The signal processing unit SP includes a front end circuit 51, a timing comparator 52, an energy comparator 53, a logic circuit 54, a timing counter 55, an energy counter 56, a delay line 57, a selector 58, an encoder 59, and memories 60 and 61. The front end circuit 51 constitutes the signal acquisition unit 41. The timing comparator 52, the logic circuit 54, the timing counter 55, and the delay line 57 constitute the timing measurement unit 42. The energy comparator 53, the logic circuit 54, and the energy counter 56 constitute the energy measurement unit 43. The memory 60 and the memory 61 are storage regions, and constitute the storage unit 44.

In this embodiment, as illustrated in FIG. 8, when viewed from the Z-axis direction, the center of the pad electrode PE1 is located to be closer to the front end circuit 51 in comparison to the center of the unit region β1 where the signal processing unit SP to which the pad electrode PE1 is connected is provided. In other words, when viewed from the Z-axis direction, the center of the pad electrode PE1 deviates from the center of the unit region β1 where the signal processing unit SP to which the pad electrode PE1 is connected is provided toward the signal acquisition unit 41. In this embodiment, the pad electrode PE1 overlaps the timing comparator 52 and the energy comparator 53 when viewed from the Z-axis direction.

The front end circuit 51 is connected to the plurality of APDs 11 included in a corresponding pixel U through the bump electrode BE and pad electrode PE1. A detection signal from the corresponding pixel U is input to the front end circuit 51. The detection signal output from the corresponding pixel U is a current signal output from the APDs 11 included in the corresponding pixel U in correspondence with incident of light. The front end circuit 51 performs predetermined processing with respect to the detection signal output from the corresponding pixel U. The front end circuit 51 inputs the processed detection signal to the timing comparator 52 and the energy comparator 53. The detection signal input to the timing comparator 52 and the energy comparator 53 has an analog waveform. As illustrated in FIG. 9, the front end circuit 51 includes a current-voltage conversion circuit 70 and a signal transfer circuit 75. FIG. 9 illustrates a configuration of the front end circuit 51.

The current-voltage conversion circuit 70 converts the detection signal input from the corresponding pixel U into a voltage signal. The current-voltage conversion circuit 70 includes current-voltage conversion resistors 71 and 72, and a bias circuit 73. A voltage signal output from the current-voltage conversion resistor 71 is input to the timing comparator 52. A voltage signal output from the current-voltage conversion resistor 72 is input to the energy comparator 53. The signal transfer circuit 75 is disposed between the current-voltage conversion resistor 72 and the energy comparator 53. The signal transfer circuit 75 inputs the voltage signal output from the current-voltage conversion resistor 72 of the current-voltage conversion circuit 70 to the energy comparator 53 of the energy measurement unit 43. A bias circuit 73 is respectively connected to the current-voltage conversion resistors 71 and 72. As illustrated in FIG. 9, A bias voltage is applied to the front end circuit 51 from the outside. The bias voltage is applied to the bias circuit 73.

The signal transfer circuit 75 includes an inverter 76, and a capacitor 78 that functions as a Miller capacitor 77, and functions a variable capacitance circuit. FIG. 10 illustrates a partial configuration of the signal transfer circuit 75. The capacitor 78 is connected to the inverter 76 in parallel. A threshold voltage is set to the inverter 76. The inverter 76 generates a negative gain corresponding to an input voltage when the input voltage is equal to or greater than the threshold voltage. The inverter 76 generates a positive gain corresponding to the input voltage when the input voltage is less than the threshold voltage. As a result, the signal transfer circuit 75 can behave as if a capacitor having capacitance greater than capacitance of the capacitor 78 alone is connected to the energy comparator 53 in parallel with the current-voltage conversion resistor 72 due to a Miller effect. In other words, the capacitor 78 in the signal transfer circuit 75 functions as a Miller capacitor 77 having apparent capacitance due to the Miller effect. The apparent capacitance, that is, Miller capacitance increases in accordance with an increase in the input voltage to the signal transfer circuit 75.

The capacitor 78 is connected to the energy comparator 53 in parallel with the current-voltage conversion resistor 72. Accordingly, the signal transfer circuit 75 includes the Miller capacitor 77 that is connected to the energy measurement unit 43 in parallel with the current-voltage conversion circuit 70. The detection signal that is input to the energy comparator 53 becomes a gentle waveform as capacitance of a capacitor that is connected in parallel with the current-voltage conversion resistor 72 is greater. Accordingly, the detection signal that is input to the energy comparator 53 becomes a gentler waveform in comparison to a case where only the capacitor 78 is connected to the energy comparator 53 in parallel with the current-voltage conversion resistor 72 due to the Miller effect corresponding to the input voltage to the signal transfer circuit 75. The energy measurement unit 43 measures energy of incident light of a corresponding pixel U, based on the waveform of the detection signal that is input to the energy comparator 53.

The timing comparator 52 and the energy comparator 53 select a signal to be output in correspondence with a pulse height of the waveform of the detection signal output from the front end circuit 51. The detection signal output from the timing comparator 52 and the energy comparator 53 is input to the logic circuit 54. A signal output from the timing comparator 52 and the energy comparator 53 has a digital waveform. Only in a case where the intensity of the detection signal output from the front end circuit 51 exceeds a predetermined threshold value, the timing comparator 52 and the energy comparator 53 output a high signal or a low signal. In this embodiment, the timing comparator 52 and the energy comparator 53 output the high signal in a case where the intensity of the input signal exceeds the threshold value, and output the low signal in a case where the intensity of the input signal does not exceed the threshold value. That is, the timing comparator 52 and the energy comparator 53 output a detection signal having a digital waveform corresponding to the waveform of the detection signal transmitted from a corresponding pixel U.

A clock signal supplied from the clock driver 35 and a control signal are input to the logic circuit 54 in addition to the detection signal transmitted from the timing comparator 52 and the energy comparator 53. The control signal is supplied from the outside of an ASIC constituted by the circuit substrate 20. The control signal includes a reset signal and a stop signal. The clock signal, the reset signal, and the stop signal are H/L signals. The logic circuit 54 controls supply of the clock signal to the timing counter 55 in correspondence with the control signal and the detection signal from the timing comparator 52. The logic circuit 54 controls supply of the clock signal to the energy counter 56 in correspondence with the control signal and the detection signal from the energy comparator 53.

The logic circuit 54 gives an instruction for the timing counter 55 and the energy counter 56 to reset count by the reset signal. The logic circuit 54 gives an instruction for the timing counter 55 and the energy counter 56 to terminate a measurement period by the stop signal.

The logic circuit 54 synchronizes the control signal and the clock signal. The logic circuit 54 supplies the control signal, the detection signal converted into a digital waveform, and the clock signal to the timing counter 55, the energy counter 56, the delay line 57, and the selector 58. The logic circuit 54 generates a signal for causing the selector 58 to select a memory that stores a count result of the energy counter 56 and the encoder 59, and supplies the signal to the selector 58.

The timing counter 55 counts the number of clock signals corresponding to time from initiation timing of a measurement period to timing at which light is incident on a corresponding pixel U, based on the detection signal input from the logic circuit 54. The energy counter 56 counts the number of clock signals corresponding to energy of light incident on the corresponding pixel U, based on the detection signal input from the logic circuit 54. The timing counter 55 and the energy counter 56 stores the count result in the memory 60 or the memory 61.

The delay line 57 includes a plurality of delay elements. The delay line 57 creates a time interval shorter than a period of a clock signal through an operation of the plurality of delay elements. The delay line 57 is controlled by a control voltage supplied from the PLL 33. The encoder 59 counts the number of stages in which the delay elements of the delay line 57 operate in correspondence with a signal transmitted from the delay line 57 and converts the number of stages into a binary signal. For example, the encoder 59 counts the number of delay elements which operate from rising of the detection signal converted into a digital waveform in the logic circuit 54 to rising of the subsequent clock signal. The encoder 59 stores the count result in the memory 60 or the memory 61.

The selector 58 selects a memory that stores count results of the timing counter 55, the energy counter 56, and the encoder 59. In this embodiment, the selector 58 selects a memory that stores the count results from the memory 60 and the memory 61, based on a signal that is input from the logic circuit 54.

The memory 60 and the memory 61 of the signal processing unit SP store measurement results of the timing measurement unit 42 and the energy measurement unit 43 with respect to light incident on a corresponding pixel U at timings different from each other in a predetermined measurement period. In this embodiment, the memory 60 and the memory 61 are storage regions of storage media which are physically separated from each other. The memory 60 and the memory 61 may be different storage regions in physically the same storage medium. Data stored in the memory 60 and the memory 61 is output to the I/O port 38 as data of a corresponding pixel U.

Next, an operation of the light detection device 1 according to this embodiment will be described. In the light detection substrate 10, each of the APDs 11 operates in Geiger mode. In Geiger mode, a reverse voltage greater than a breakdown voltage of the APD 11 is applied between an anode and a cathode of the APD 11. The reverse voltage may be referred to as a reverse bias voltage. In this embodiment, the anode the first semiconductor region PA, and the cathode is the third semiconductor region NA. The first semiconductor region PA is electrically connected to an electrode (not illustrated) disposed on the main surface 1Na side of the semiconductor substrate 50 through the second semiconductor region PB. The electrode is electrically connected to the pad electrode PE2. The third semiconductor region NA is electrically connected to an electrode (not illustrated). For example, a negative potential is applied to the first semiconductor region PA through the pad electrode PE2, and a positive potential is applied to the third semiconductor region NA. The polarities of the potentials are relative to each other.

When light (photon) is incident on the APD 11 included in the pixel U, photoelectric conversion is performed inside the semiconductor substrate and photoelectrons are generated. Avalanche multiplication is performed in a region near a PN junction interface of the first semiconductor region PA. An amplified electrode group flows to the circuit substrate 20 through the second semiconductor region PB and the above-described electrode disposed on the main surface 1Na side of the semiconductor substrate 50. The electrode group flows to the third semiconductor region NA from the circuit substrate 20 through the bump electrode BE, the pad electrode PE1, the electrode 22, and the quenching resistor 21. A current signal is detected by the circuit substrate 20 through the quenching resistor 21, the electrode 22, the pad electrode PE1, and the bump electrode BE. In other words, when light is incident on any one of light-receiving regions S in the light detection substrate 10, the generated photoelectrons are multiplied, and a signal due to the multiplied photoelectrons is drawn from the bump electrode BE and is input to a corresponding signal processing unit SP. A signal from the APD 11 included in a corresponding pixel U is input to the signal processing unit SP. In the signal processing unit SP, a signal transmitted from a plurality of the APDs 11 included in the corresponding pixel U is processed and the result is output as pixel data.

Figure 11:
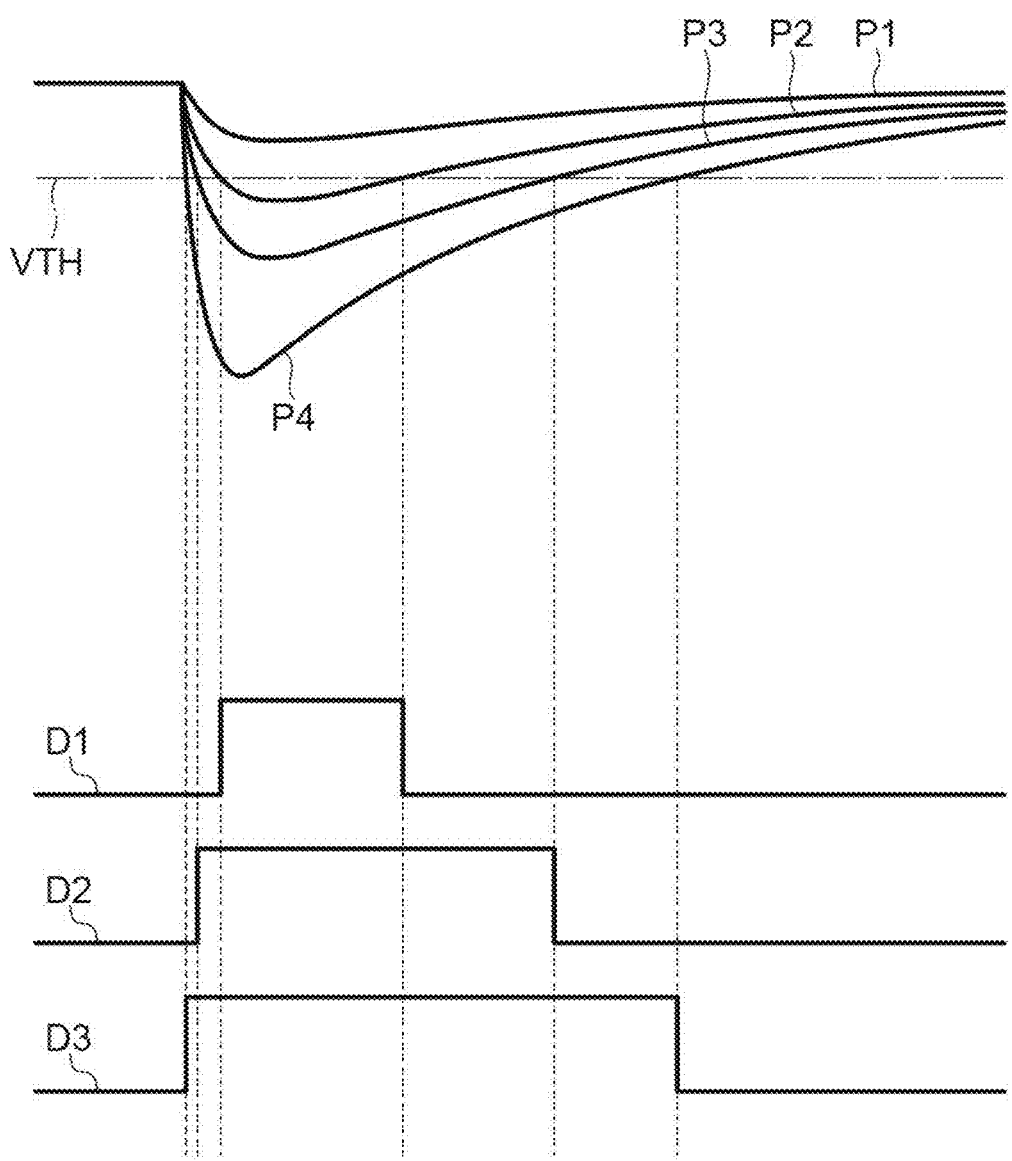
FIG. 11 is a view for describing a processing operation of an energy comparator and a logic circuit.
Figure 12:
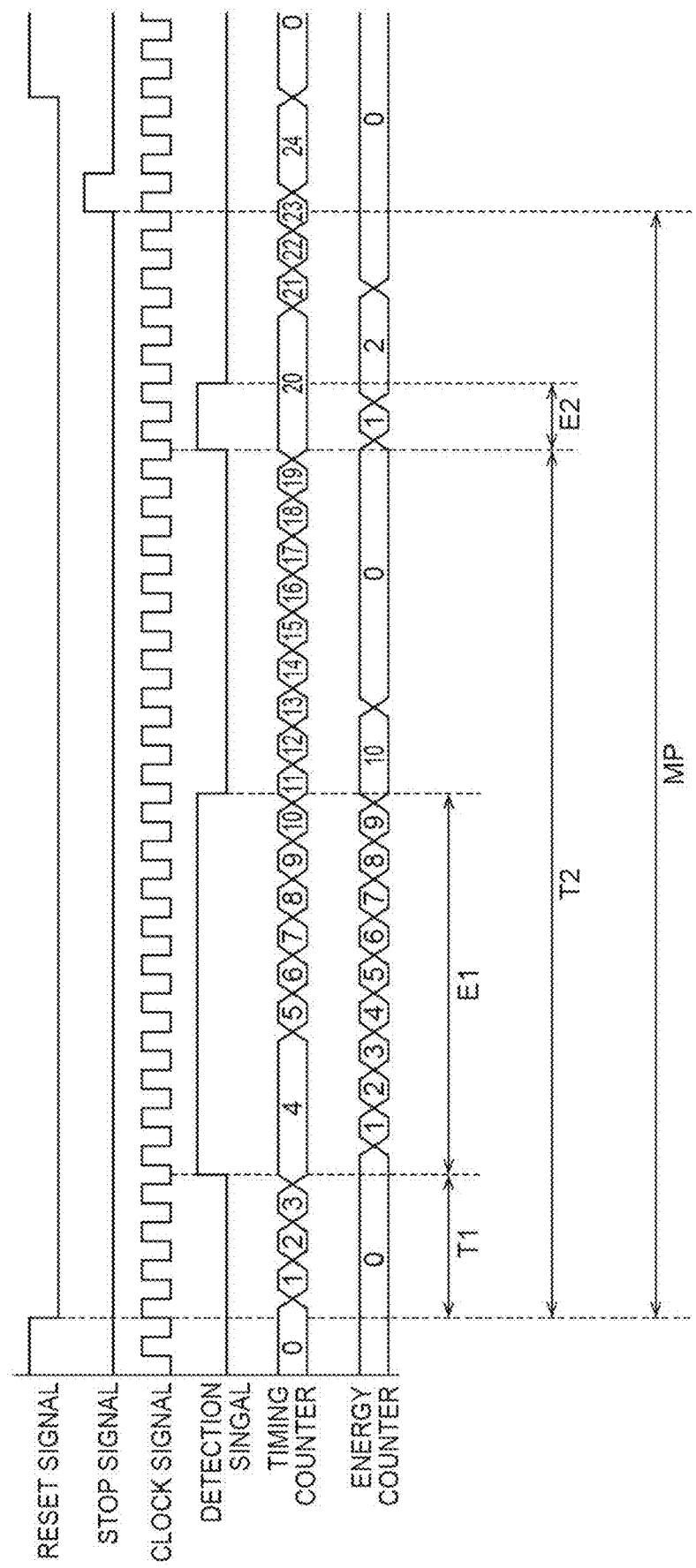
FIG. 12 is a timing chart illustrating an operation of the signal processing unit.

Next, an operation of the signal processing unit SP in this embodiment will be described in detail with reference to FIG. 11 and FIG. 12. FIG. 11 is a view for describing a processing operation of the energy comparator 53 and the logic circuit 54. FIG. 12 is a timing chart illustrating the operation of the signal processing unit.

The timing measurement unit 42 and the energy measurement unit 43 performs processing with respect to a detection signal output from a corresponding signal acquisition unit 41 by using the timing comparator 52, the energy comparator 53, and the logic circuit 54. Specifically, the timing measurement unit 42 selects a detection signal output from the front end circuit 51 by the timing comparator 52, and outputs the selected detection signal as a digital waveform. The energy measurement unit 43 selects a detection signal output from the front end circuit 51 by the energy comparator 53, and outputs the selected detection signal as a digital waveform. The detection signal output from the logic circuit 54 is an H/L signal.

Description will be given of processing of converting the detection signal output from the front end circuit 51 from an analog waveform into a digital waveform by using the energy comparator 53 and the logic circuit 54 with reference to FIG. 11. In FIG. 11, analog signals P1, P2, P3, and P4 input to the energy comparator 53 are illustrated in a superimposed state for explanation. The analog signals P1, P2, P3, and P4 are voltage signals and a pulse height represents a voltage intensity. The analog signals P1, P2, P3, and P4 have pulse heights different from each other. In FIG. 11, threshold values VTH set to the energy comparator 53 are illustrated in correspondence with intensities of the analog signals P1, P2, P3, and P4. In FIG. 11, digital signals D1, D2, and D3 output from the energy comparator 53 are illustrated. The digital signals D1, D2, and D3 are H/L signals, and correspond to the analog signals P2, P3, and P4, respectively.

In the example illustrated in FIG. 11, the energy comparator 53 converts an analog signal having a waveform of a component exceeding the threshold value VTH in the detection signal transmitted from the front end circuit 51 into a digital signal, and outputs the analog signal. An analog signal P1 has the maximum intensity lower than the threshold value VTH. According to this, in a case where the analog signal P1 is input to the energy comparator 53, the energy comparator 53 outputs a constant signal. In this embodiment, in this case, the energy comparator 53 outputs a low signal.

The analog signals P2, P3, and P4 have the maximum intensity higher than the threshold value VTH. According to this, in a case where the analog signals P2, P3, and P4 are input to the energy comparator 53, the energy comparator 53 outputs an H/L signal corresponding to a waveform of a component exceeding the threshold value VTH. As illustrated in FIG. 11, the digital signals D1, D2, and D3 output from the energy comparator 53 are changed from Low to High at timing at which the corresponding analog signals P2, P3, and P4 exceed the threshold value VTH. The digital signals D1, D2, and D3 output from the energy comparator 53 are changed from High to Low at timing at which the corresponding analog signals P2, P3, and P4 are lower than the threshold value VTH. The digital signals D1, D2, and D3 are supplied to the energy counter 56 through the logic circuit 54.

The timing measurement unit 42 detects rising or falling of the detection signal output from the logic circuit 54, and measures timing at which light is incident on a corresponding pixel U by the timing counter 55. The energy measurement unit 43 detects rising or falling of the detection signal output from the logic circuit 54, and measures time between the rising and the falling as energy of incident light on the corresponding pixel U by the energy counter 56.

In FIG. 12, a reset signal, a stop signal, a clock signal, and a detection signal which are output from the logic circuit 54, a count of the timing counter 55, and a count of the energy counter 56 are sequentially illustrated from an upper side. The reset signal corresponds to initiation of a measurement period MP, and the stop signal corresponds to termination of the measurement period MP. The measurement period MP of the incident light on the pixel U is determined by the reset signal and the stop signal. For example, the reset signal represents timing at which light is projected from a light source in a measurement device. The stop signal represents timing that is determined in advance in correspondence with a range where a detection operation for a target is performed.

The timing counter 55 and the energy counter 56 perform count reset with the reset signal transmitted from the logic circuit 54 set as a trigger. When detecting falling of the reset signal, the timing counter 55 initiates counting in synchronization with the clock signal. When detecting falling of the reset signal, the energy counter 56 enters a stand-by state.

The timing counter 55 outputs a count result with a detection signal based on the output signal from the timing comparator 52 set as a trigger. The timing counter 55 inputs a count result until rising of the detection signal is detected after falling of the reset signal is detected in the memories 60 and 61.

For example, in an example illustrated in FIG. 12, the timing measurement unit 42 and the energy measurement unit 43 measures light incident on a corresponding pixel U at timings different from each other in the measurement period MP. Accordingly, falling of the reset signal occurs during the measurement period MP. The timing counter 55 inputs a count until rising of a first detection signal is detected after falling of the reset signal is detected in the memory 60 as a first timing measurement result T1. The timing counter 55 inputs a count until rising of a second detection signal is detected after falling of the reset signal is detected in the memory 61 as a second timing measurement result T2.

The energy counter 56 performs initiation and termination of counting with a detection signal based on the output signal from the energy comparator 53 set as a trigger. The energy counter 56 inputs a count result until falling of the detection signal is detected after rising of the detection signal is detected in the memories 60 and 61.

For example, in the example illustrated in FIG. 12, the energy counter 56 inputs a count until falling of a first detection signal is detected after rising of the first detection signal is detected in the memory 60 as a first energy measurement result E1. The energy counter 56 inputs a count until a second detection signal falls after rising of the second detection signal is detected in the memory 61 as a second energy measurement result E2.

The count result obtained by the timing counter 55 is synchronized with a period of the clock signal. Accordingly, the timing counter 55 cannot measure time in a period shorter than that of the clock signal. The count result obtained by the timing counter 55 includes an error equal to or shorter than the period of the clock signal. In this embodiment, more accurate data is derived by correcting the count result obtained by the timing counter 55 with the count result of the encoder 59.

Figure 13:
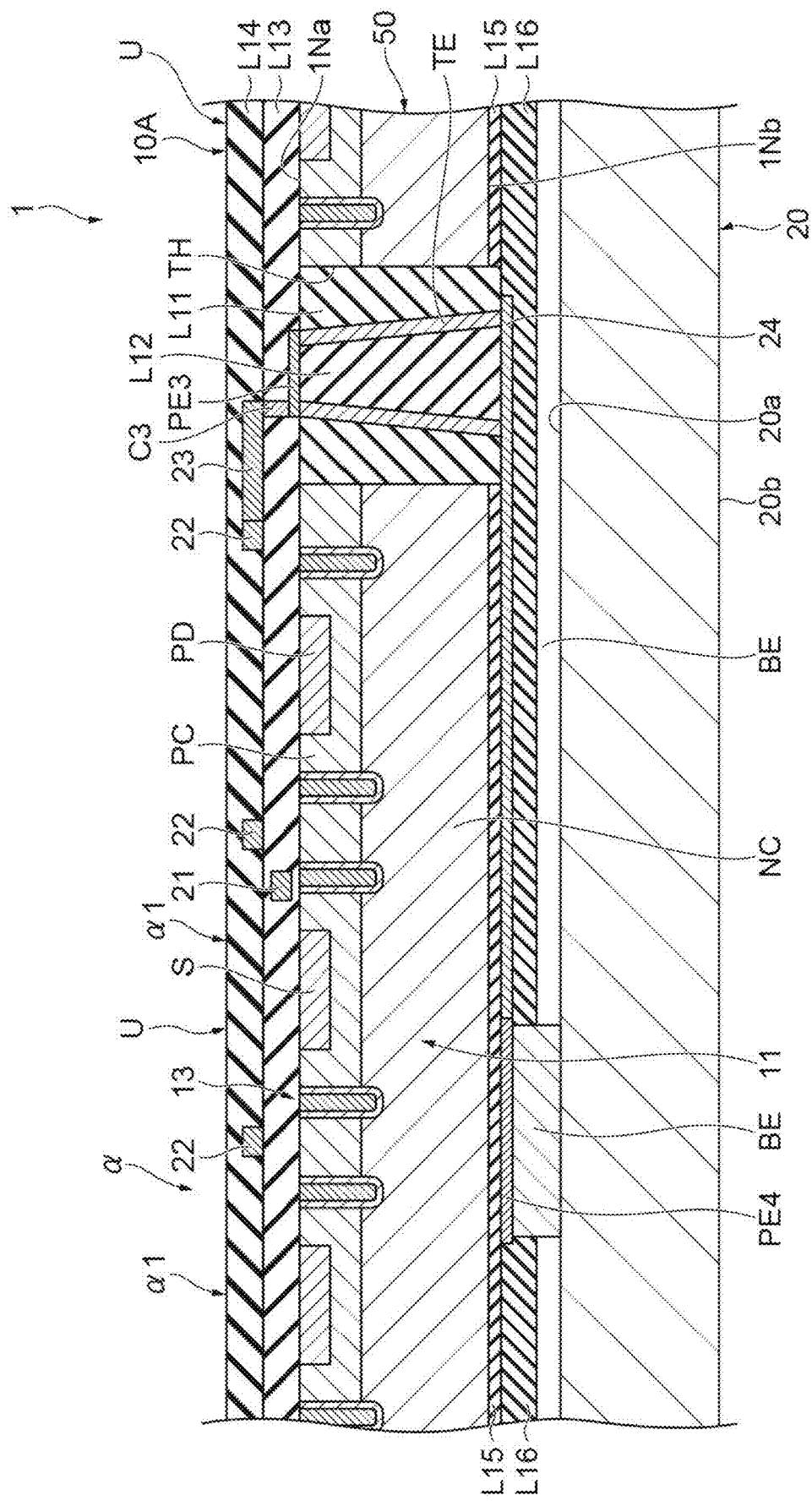
FIG. 13 is a view illustrating a cross-sectional configuration of a light detection device related to a modification example of this embodiment.

In this embodiment, description has been given of a case where the light detection device 1 is a so-called rear-surface incident type semiconductor light detection device. However, as a modification example of this embodiment, the light detection device 1 may be a so-called front-surface incident type semiconductor light detection device. Description will be given of a configuration of a light detection substrate in a case where the light detection device 1 is the front-surface incident type semiconductor light detection device with reference to FIG. 13. FIG. 13 illustrates a cross-sectional configuration of the light detection device 1 according to the modification example of this embodiment. In this modification example, the light detection device 1 is different from the light detection device 1 according to this embodiment in that a light detection substrate 10A is provided instead of the light detection substrate 10. The light detection substrate 10A according to this modification example is a light detection substrate that is used in the so-called front-surface incident type semiconductor light detection device. That is, the light detection device 1 according to this modification example is a front-surface incident type semiconductor light detection device.

In the light detection substrate 10A, a plurality of light-receiving regions S are provided on the main surface 1Na side of a semiconductor substrate 50. Each of APDs 11 includes a P-type first semiconductor region PC, an N-type second semiconductor region NC, and a P-type third semiconductor region PD. The first semiconductor region PC is located on a main surface 1Na side of the semiconductor substrate 50. The second semiconductor region NC is located on a main surface 1Nb side of the semiconductor substrate 50. The third semiconductor region PD is formed within a first semiconductor region PC. A concentration of impurities of the third semiconductor region PD is higher than a concentration of impurities of the first semiconductor region PC. The third semiconductor region PD is a light-receiving region S. Each of the APDs 11 is constituted by a P$^+$ layer that is the third semiconductor region PD, a P layer that is the first semiconductor region PC, and an N$^+$ layer that is the second semiconductor region NC in this order from the main surface 1Na side.

A groove 13 is formed in the semiconductor substrate 50 of the light detection substrate 10A to surround the third semiconductor region PD. As illustrated in FIG. 13, the groove 13 passes through the first semiconductor region PC in the Z-axis direction and reaches the second semiconductor region NC.

The light detection substrate 10A includes a through-electrode TE for every pixel U in addition to a plurality of APDs 11 and a plurality of quenching resistor 21. The through-electrode TE passes through the semiconductor substrate 50 in a thickness direction. For example, the thickness direction corresponds to the Z-axis direction. In the light detection substrate 10A, an electrode 22 is formed in a lattice shape to pass between a plurality of the light-receiving regions S included in one pixel U when viewed from the Z-axis direction on the main surface 1Na side. Each of the quenching resistors 21 is disposed on the main surface 1Na side of the semiconductor substrate 50.

An electrode 23 extends from the electrode 22, and is electrically connected to a corresponding through-electrode TE. All quenching resistors 21 included in one pixel U are electrically connected to one through-electrode TE in parallel by the electrode 22 and the electrode 23.

A plurality of the through-electrodes TE are located in a light detection region α where a plurality of the pixels U are two-dimensionally arranged when viewed from the Z-axis direction. Each of the through-electrodes TE is disposed in a region surrounded by four adjacent pixels U except for a through-electrode TE located at the end of the light detection substrate 10. The through-electrode TE is electrically connected to one pixel U among the four adjacent pixels U. The through-electrode TE and the pixel U are alternately arranged in a direction orthogonal to the X-axis and the Y-axis. The through-electrode TE is electrically connected to the plurality of APDs 11 included in a corresponding pixel U through the quenching resistor 21, the electrode 22, and the electrode 23.

The through-electrode TE is disposed inside a through-hole TH formed in the Z-axis direction. An insulating layer L11, the through-electrode TE, and an insulating layer L12 are arranged in the through-hole TH. The insulating layer L11 is formed on an inner peripheral surface of the through-hole TH. The insulating layer L11 is located between the through-electrode TE and the through-hole TH. The insulating layer L12 is disposed in a space formed on an inner side of the through-electrode TE. In this embodiment, the through-electrode TE has a tubular shape. Members disposed in the through-hole TH include the insulating layer L11, the through-electrode TE, and the insulating layer L12 in this order from the inner peripheral surface side of the through-hole TH.

The light detection substrate 10A includes a pad electrode PE3, an electrode 24, and a pad electrode PE4 for every pixel U. The pad electrodes PE3 and PE4, and the electrode 24 are arranged in correspondence with the through-electrode TE. The pad electrode PE3 is located on the main surface 1Na side, and the electrode 24 and the pad electrode PE4 are located on the main surface 1Nb side. The pad electrode PE3 is electrically connected to the electrode 23 through a connection portion C3. The pad electrode PE3 is electrically connected to the electrode 23 and the through-electrode TE.

The insulating layer L13 is disposed on the first semiconductor region PC, the second semiconductor region NC, the third semiconductor region PD, and the groove 13. Each of the quenching resistors 21 and the pad electrode PE3 are covered with the insulating layer L13. The electrodes 22 and 23 are disposed on the insulating layer L13 and are covered with an insulating layer L14.

The electrode 24 and the pad electrode PE4 are disposed on the main surface 1Nb through an insulating layer L15. The electrode 24 includes an end that is connected to the through-electrode TE and an end that is connected to the pad electrode PE4. The electrode 24 connects the through-electrode TE and the pad electrode PE4 to each other. The electrode 24 is covered with an insulating layer L16. The pad electrode PE4 is connected to the bump electrode BE. The pad electrode PE4 is covered with the insulating layer L16 except for a portion that is connected to the bump electrode BE.

A plurality of the pad electrodes PE3 and PE4 of the light detection substrate 10A are located in the light detection region α where a plurality of pixels U are two-dimensionally arranged when viewed from the Z-axis direction. Each of the pad electrodes PE4 is disposed on the main surface 1Nb side to overlap at least one APD 11 among the plurality of APDs 11 provided in a corresponding pixel U when viewed from the Z-axis direction.

The electrodes 22, 23, and 24, the pad electrodes PE3 and PE4, the connection portion C3, and the through-electrode TE are formed of a metal. For example, the electrodes 22, 23, and 24, the pad electrodes PE3 and PE4, the connection portion C3, and the through-electrode TE are formed of aluminum (Al). In a case where the semiconductor substrate 50 is formed of Si, as an electrode material, for example, copper (Cu) is used in addition to aluminum. The electrodes 22, 23, and 24, the pad electrodes PE3 and PE4, the connection portion C3, and the through-electrode TE may be integrally formed. For example, the electrodes 22, 23, and 24, the pad electrodes PE3 and PE4, the connection portion C3, and the through-electrode TE are formed by a sputtering method.

The insulating layers L11, L12, L13, L14, L15, and L16 are formed of, for example, $SiO_2$, SiN, or a resin. As a method of forming the insulating layers L11, L12, L13, L14, L15, and L16, a thermal oxidation method, a sputtering method, a CVD method, or a resin coating method is used.

The light detection substrate 10A is embedded in a circuit substrate 20 as in the light detection substrate 10. The light detection substrate 10A is connected to the circuit substrate 20 in the Z-axis direction. The light detection substrate 10A and the circuit substrate 20 are connected by a bump electrode BE. Accordingly, in this modification example, the circuit substrate 20 is electrically connected to the pad electrode PE4 by the bump electrode BE. A detection signal output from the plurality of APDs 11 included in the pixels U of the light detection substrate 10A is guided to a corresponding signal processing unit SP through the quenching resistor 21, the electrode 22, the pad electrode PE4, and the bump electrode BE.

Even in this modification example, the light detection region α and the signal processing region β overlap each other at least a part when viewed from the Z-axis direction. The light detection region α includes a plurality of unit regions α1 where the plurality of pixels U are provided, respectively. The signal processing region β includes a plurality of unit regions β1 where the plurality of signal processing units SP are provided, respectively. A unit region α1 where each of the pixels U is provided and a unit region β1 where a signal processing unit SP corresponding to the pixel U is provided overlap each other at least at a part when viewed from the Z-axis direction. When viewed from the Z-axis direction, the unit region α1 where each of the pixels U is provided and the unit region β1 where the signal processing unit SP corresponding to the pixel U is provided deviate from each other in a direction along the main surface 1Na and include portions which do not overlap each other. When viewed from the Z-axis direction, the center of the pad electrode PE4 deviates from the center of the unit region β1 provided with the signal processing unit SP to which the pad electrode PE1 is connected is provided toward the signal acquisition unit 41.

As described above, the light detection device 1 includes the light detection substrate 10 or 10A including the plurality of pixels U which are two-dimensionally arranged. Each of the pixels U includes the plurality of APDs 11 operating in Geiger mode. Each of the signal processing units SP acquires the detection signal through the pad electrodes PE1 and PE4 of each of the pixels U. Accordingly, in the light detection device 1, sensitivity of each of the pixels U which are two-dimensionally arranged is improved. In this configuration, since a waveform of the light detection signal transmitted from each of the pixels U is steep, an influence of so-called time walk effect is small. Accordingly, even in the case of detecting reflected light of light that is simultaneously projected from a light source to a two-dimensional range, accuracy and precision of detection are improved.

In the light detection device 1, each of the signal processing units SP measures energy of light in the energy measurement unit 43, based on a detection signal output from each of the pixels U including the plurality of APDs 11. Accordingly, the light detection device 1 can distinguish reflected light from a target and disturbance light due to a difference in energy. Accordingly, an influence of the disturbance light is reduced from the detection result, and thus additional improvement in accuracy of detection can be achieved.

The circuit substrate 20 is connected to the light detection substrate 10 or 10A in the Z-axis direction, and the light detection region α where the plurality of pixels U are provided and the signal processing region β where the plurality of signal processing units SP are provided overlap each other at least at a part. Accordingly, a reduction in size of the light detection device 1 is achieved in a direction parallel to the main surface 1Na, and an electrical connection path between the pixel U and the signal processing unit SP is reduced.

The signal processing unit SP includes the storage unit 44. If the storage unit 44 is provided at the outside of the signal processing unit SP, an interconnection from at least the timing measurement unit 42 and the energy measurement unit 43 is drawn to the outside from the signal processing unit SP, and thus a wide space is required between the signal processing units SP adjacent to each other. In a case where a wide space is required between the adjacent signal processing units SP, it is difficult to reduce the size of the light detection device 1. In the light detection device 1, since the storage unit 44 is included in each of the signal processing units SP, the number of interconnections drawn from the signal processing unit SP to the outside of the signal processing unit SP is reduced. Accordingly, an additional reduction in size of the light detection device 1 is achieved.

The light detection substrate 10 is surrounded by edges of the circuit substrate 20 when viewed from the Z-axis direction. In this case, an additional reduction in size of the light detection device is achieved, and an electrical connection path between each pixel and each signal processing unit is further reduced.

When viewed from the Z-axis direction, the light detection region α includes the portion R1 that overlaps the signal processing region β and the portion R2 that do not overlap the signal processing region β. An area of the portion R1 is larger than an area of the portion R2. In this case, an additional reduction in size of the light detection device is achieved, and the electrical connection path between each pixel and each signal processing unit is further reduced.

The signal processing region β includes the portion R3 that does not overlap the light detection region α when viewed from the Z-axis direction. An area of the portion R1 is larger than the sum of the area of the portion R2 and the area of the portion R3. In this case, an additional reduction in size of the light detection device is achieved, and the electrical connection path between each pixel and each signal processing unit is further reduced.

The unit region α1 where each of the plurality of pixels U is provided in the light detection region α, and the unit region β1 where a signal processing unit SP corresponding to the pixel U is provided in the signal processing region β overlap at least at a part when viewed from the Z-axis direction. In this case, an addition reduction in size of the light detection device 1 is achieved, and the electrical connection path between each of the pixels U and each of the signal processing units SP is further reduced.

The center of the pad electrode PE1 or PE4 deviates from the center of the unit region β1 where the signal processing unit SP to which the pad electrode PE1 or PE4 is connected is provided toward the signal acquisition unit 41 when viewed from the Z-axis direction. In this case, the electrical connection path between each of the pixels U and each of the signal processing units SP is further reduced. When viewed from the Z-axis direction, an interconnection for applying a drive voltage to the signal processing unit SP can be provided at the center of the signal processing unit SP, and thus routing of the interconnection becomes easy.

The unit region α1 where each of the pixels U is provided in the light detection region α, and the unit region β1 where a signal processing unit SP corresponding to the pixel U is provided in the signal processing region β deviate from each other in a direction along the main surface 1Na when viewed from the Z-axis direction. The unit region α1 where each of the pixels U is provided, and the unit region β1 where a signal processing unit SP corresponding to the pixel U is provided include portions which do not overlap each other. In this case, the electrical connection path between the pixel U and the signal processing unit SP can be further reduced.

A detection signal output from a corresponding pixel U is a current signal. The signal acquisition unit 41 includes the current-voltage conversion circuit 70 and the signal transfer circuit 75. The current-voltage conversion circuit 70 converts the detection signal into a voltage. The signal transfer circuit 75 input the voltage signal output from the current-voltage conversion circuit 70 to the energy measurement unit 43. The signal transfer circuit 75 includes the Miller capacitor 77.

The Miller capacitor 77 is connected to the energy measurement unit 43 in parallel with the current-voltage conversion circuit 70. The energy measurement unit 43 measures energy of light incident on a corresponding pixel U, based on a waveform of a signal input from the signal transfer circuit 75. In this manner, since a capacitor is connected to the energy measurement unit 43 in parallel with the current-voltage conversion circuit 70, the waveform becomes gentle. When the waveform becomes gentle, precision in energy measurement in the energy measurement unit 43 can be improved.

Figure 14:
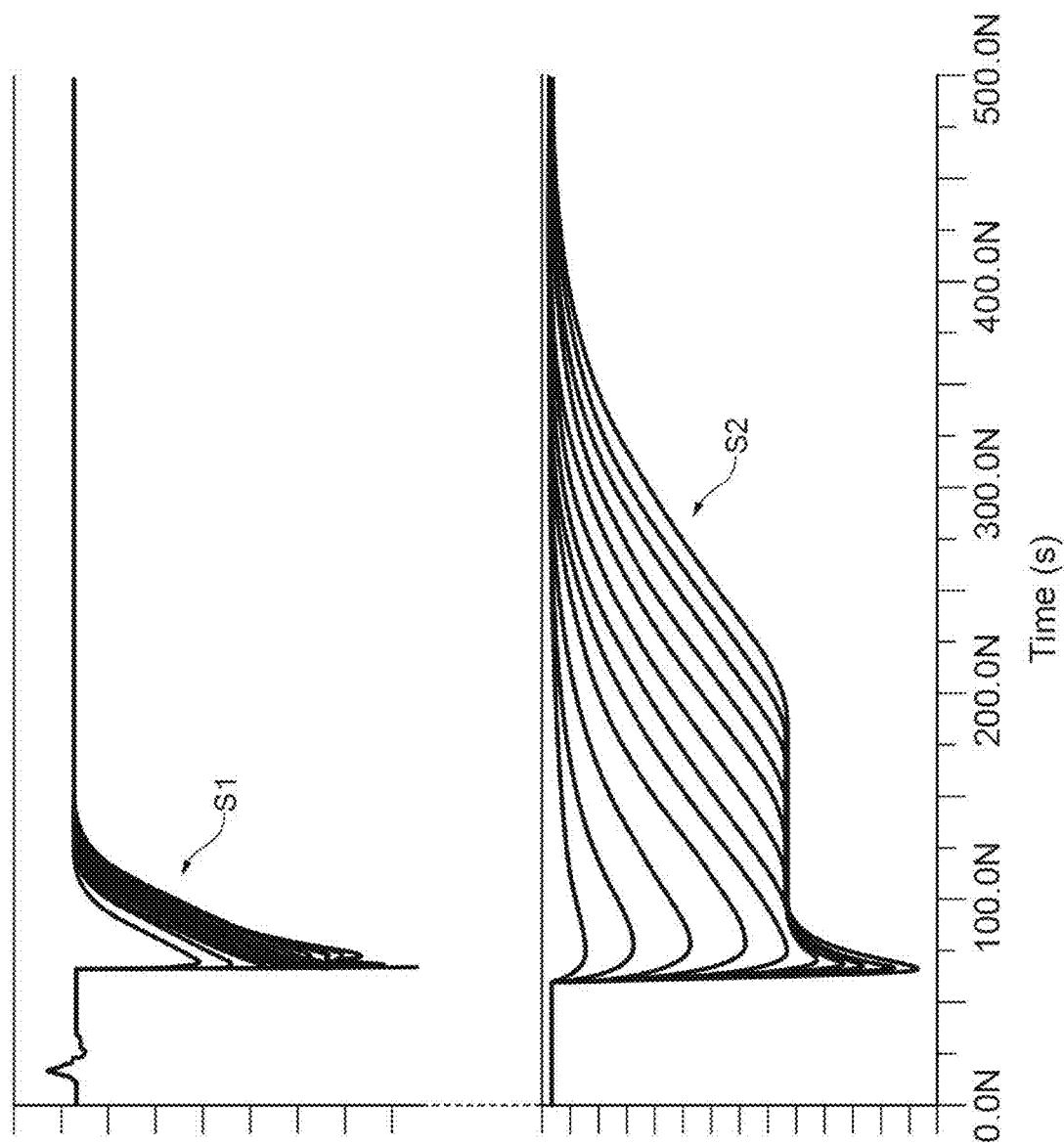
FIG. 14 is a view for describing processing in a signal transfer circuit.

FIG. 14 is a view comparing a signal input to the timing comparator 52 and a signal input to the energy comparator 53. Each of a plurality of signals S1 represents a signal that is input to the timing comparator 52 in a case where light beams having intensities different from each other are incident on the pixel U. Each of a plurality of signals S2 represents a signal that is input to the energy comparator 53 in a case where light beams having intensities different from each other are incident on the pixel U. A signal transfer circuit including a capacitor is not provided at a front stage of the timing comparator 52, but the signal transfer circuit 75 including the capacitor 78 is provided at a front stage of the energy comparator 53.

In a case where a capacitor is provided in the energy measurement unit 43 in parallel with the current-voltage conversion circuit 70, a waveform of a signal that is input to the energy comparator 53 becomes gentle due to discharge of the capacitor. When the waveform of the signal that is input to the energy comparator 53 becomes gentle, a difference in measurement time in the energy counter 56 which corresponds to a difference in energy of light incident on the pixel U also becomes large. Accordingly, precision of energy measurement in the energy measurement unit 43 is improved. The signal waveform becomes gentle as electrical capacitance of a capacitor connected to the energy measurement unit 43 in parallel with the current-voltage conversion circuit 70 is larger.

In the light detection device 1, the signal transfer circuit 75 includes the Miller capacitor 77 constituted by the capacitor 78. In this case, it is possible to obtain the same operation as in a case where a capacitor having larger electrical capacitance is used in correspondence with a voltage that is input to the signal transfer circuit 75 without enlarging a size of a capacitor region. Accordingly, the plurality of signal processing units SP can be formed in a compact manner in conformity to the plurality of pixels U which are two-dimensionally arranged while securing precision in energy measurement.

The energy measurement unit 43 measures energy of light incident on a corresponding pixel U by measuring time for which a pulse height of a signal that is input from a corresponding signal acquisition unit 41 is equal to or greater than the threshold value VTH. The energy measurement unit 43 can be realized by simple digital processing and can also be physically configured in a compact manner. Accordingly, a size of a region of the energy measurement unit 43 is reduced. As a result, the plurality of signal processing units SP can be formed in a compact manner in conformity to the plurality of pixels U which are two-dimensionally arranged.

The storage unit 44 of each of the signal processing units SP includes a plurality of memories 60 and 61. The plurality of memories 60 and 61 respectively store measurement results in the timing measurement unit 42 and the energy measurement unit 43 with respect to incident light that is incident on a corresponding pixel U at timings different from each other in a predetermined measurement period. The light detection device 1 includes the memories 60 and 61. Accordingly, even when measurement results for disturbance light incident on the pixel U are output from the timing measurement unit 42 and the energy measurement unit 43 in the predetermined measurement period, a measurement result for reflection light from a target is also stored. For example, as in the example illustrated in FIG. 12, even when a signal due to disturbance light is output from the logic circuit 54, energy measurement results E1 and E2 obtained a plurality of times in the measurement period MP are stored. Accordingly, even though the energy measurement result E1 is a measurement result based on a signal due to the disturbance light, a measurement result for reflected light from a target can be stored as the energy measurement result E2. In the light detection device 1, the above-described plurality of memories 60 and 61 are included in each of the signal processing units SP. Accordingly, an influence of the disturbance light is reduced, and the number of interconnections drawn to the outside of the signal processing unit SP from the signal processing unit SP is reduced.

Hereinbefore, description has been given of the embodiment and the modification example of the invention, but the invention is not limited to the embodiment and the modification example described above, and various modifications can be made in a range not departing from the gist of the invention.

Figure 15:
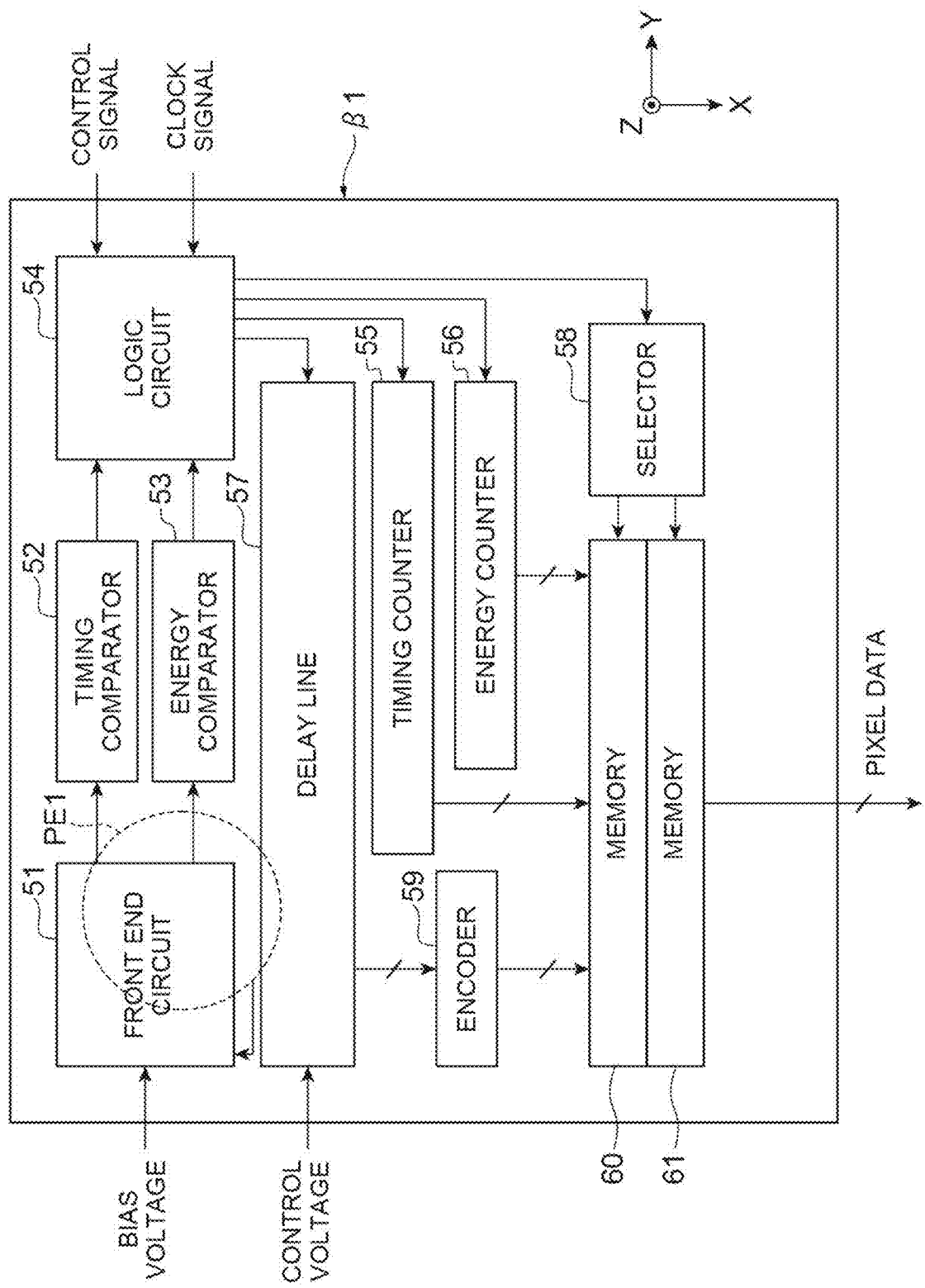
FIG. 15 is a view illustrating a positional relationship between a pixel and a signal processing unit according to the modification example of this embodiment.
Figure 16:
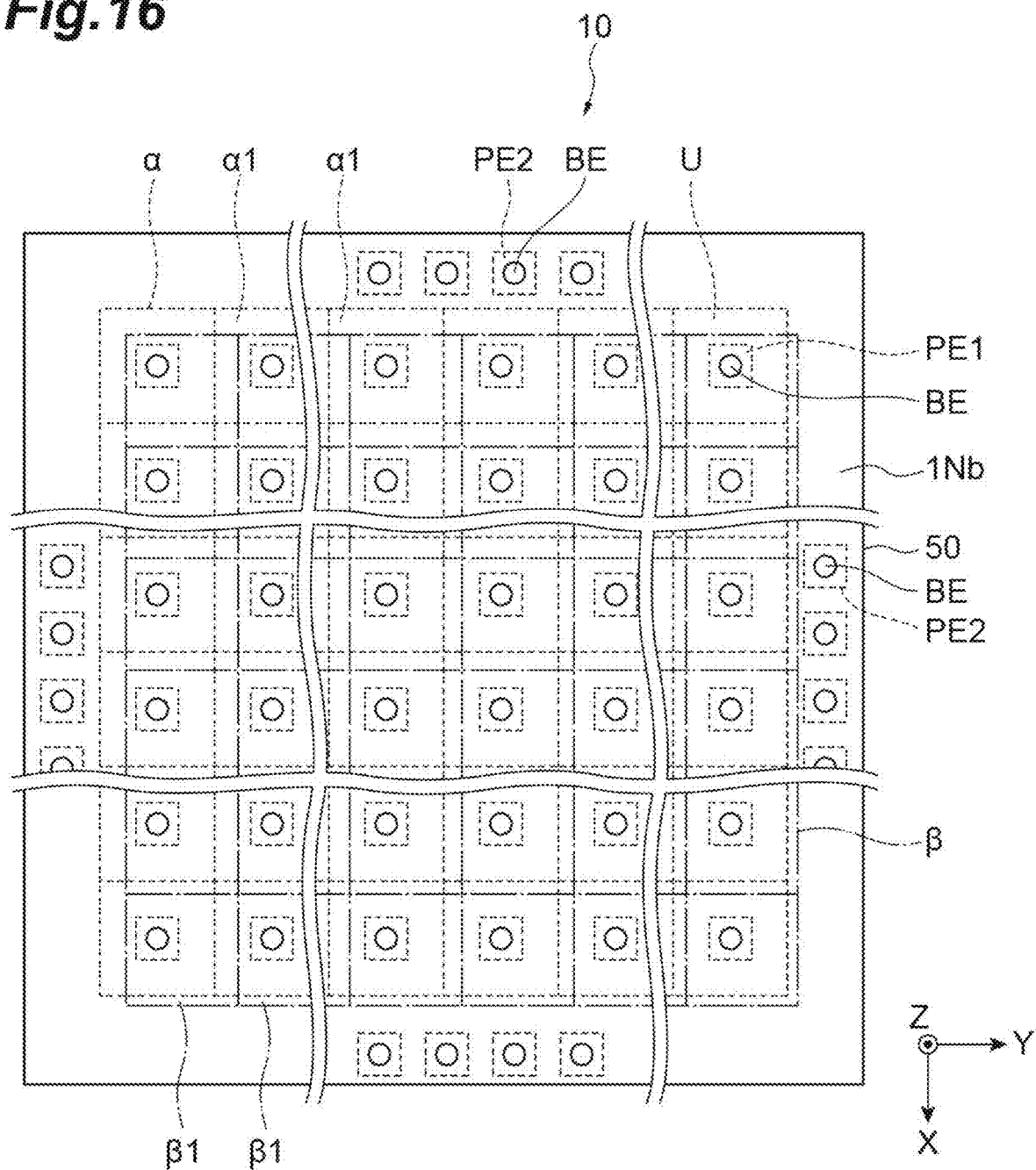
FIG. 16 is a view illustrating a positional relationship between a signal acquisition unit and a pad electrode according to the modification example of this embodiment.

For example, in the above-described embodiment, as illustrated in FIG. 8, the pad electrode PE1 overlaps the timing comparator 52 and the energy comparator 53 when viewed from the Z-axis direction. As illustrated in FIG. 3, the unit region α1 where each of the pixels U is provided and the unit region β1 where a corresponding signal processing unit SP is provided deviate from each other in the X-axis direction. However, as a modification example of this embodiment, as illustrated in FIG. 15, the pad electrode PE1 may overlap the front end circuit 51 when viewed from the Z-axis direction. In this modification example, as illustrated in FIG. 16, the light detection region α and the signal processing region β deviate from each other in the XY-axis direction when viewed from the Z-axis direction. FIG. 15 is a view illustrating a positional relationship between a pixel and a signal processing unit in this modification example. FIG. 16 is a view illustrating a positional relationship between a signal acquisition unit and a pad electrode in this modification example.

Figure 17:
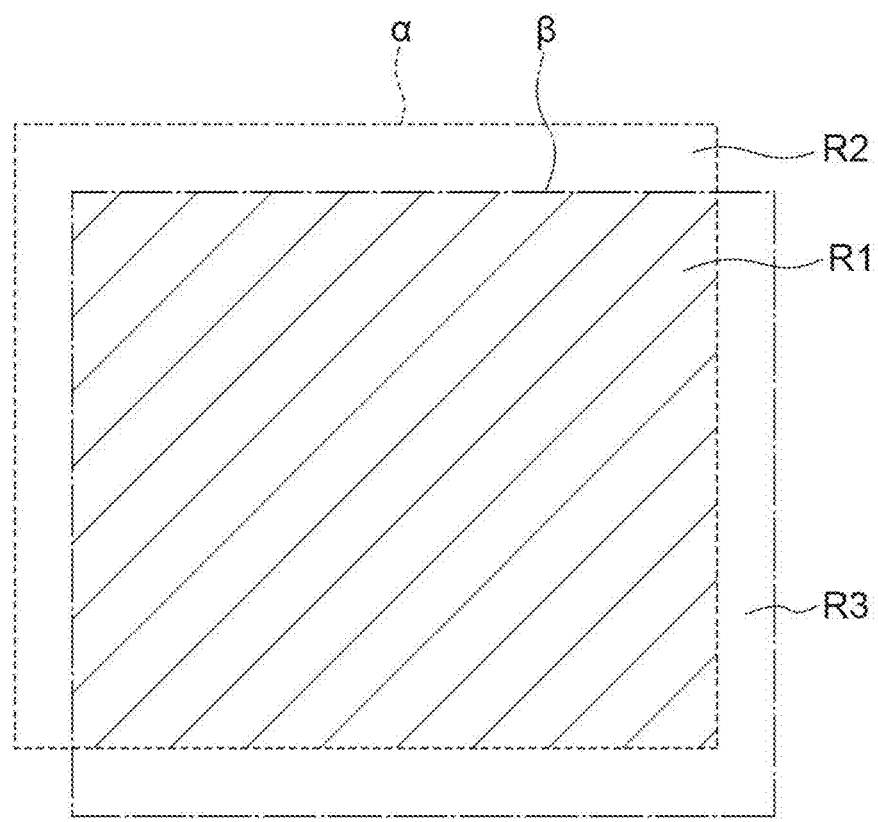
FIG. 17 is a schematic view illustrating a positional relationship between a light detection region and a signal processing region according to the modification example of this embodiment.

FIG. 17 illustrates a positional relationship between a light detection region α and a signal processing region β when viewed from the Z-axis direction in the modification example illustrated in FIG. 15 and FIG. 16. Even in this modification example, the light detection region a includes a portion R1 that overlaps the signal processing region β and a portion R2 that does not overlap the signal processing region β when viewed from the Z-axis direction. The signal processing region β includes a portion R1 that overlaps the light detection region α and a portion R3 that does not overlap the light detection region α when viewed from the Z-axis direction. In FIG. 17, the portion R1 is hatched. When viewed from the Z-axis direction, an area of the portion R1 is greater than an area of the portion R2. When viewed from the Z-axis direction, the area of the portion R1 is greater than the sum of the area of the portion R2 and an area of the portion R3.

As illustrated in FIG. 16, the unit region β1 where a corresponding signal processing unit SP is provided deviates from the unit region α1 where each of the pixels U is provided in the X-axis direction and the Y-axis direction. FIG. 15 illustrates a positional relationship between the pixel U and the signal processing unit SP in the light detection device 1 according to the modification example of this embodiment. FIG. 16 is a view illustrating a positional relationship between the signal acquisition unit 41 and the pad electrode PE1 in the light detection device 1 according to the modification example of this embodiment.

In the embodiment and the modification example described above, the light detection substrate 10 or 10A and the circuit substrate 20 are connected to each other by the bump electrode BE, but the configuration of the light detection device 1 is not limited thereto. The pad electrode PE1 or PE4 of the light detection substrate 10 or 10A and the signal processing unit SP of the circuit substrate 20 may be electrically connected to each other through the bump electrode BE.

In the above-described embodiment, the energy measurement unit 43 measures time for which a pulse height of a signal that is input from a corresponding signal acquisition unit 41 is equal to or greater than a threshold value by using the TOT circuit so as to measure energy of light incident on a corresponding pixel U. However, as a modification example of this embodiment, the energy measurement unit 43 may measure energy by an analog-digital-converter (ADC). In this case, the energy measurement unit 43 can detect a pulse height of a signal that is input from the corresponding signal acquisition unit 41 with high precision, and thus the energy measurement unit 43 can measure energy of light incident on the corresponding pixel U with high precision. As a modification example of this embodiment, the energy measurement unit 43 may measure the energy by a plurality of comparators in which threshold values are different from each other. In the case of the modification examples, the energy measurement unit 43 requires a large space in comparison to a case of using the TOT circuit.

In the embodiment and the modification example described above, each of the signal processing units SP is connected to only one pad electrode PE1. The plurality of signal processing units SP are connected to the pixels U only in one-to-one relationship through a corresponding pad electrode PE1. The light detection device 1 does not include a switch configured to switch electrical connection between each of the pixels U and the signal processing unit SP corresponding to the pixel U. In other words, a signal output from each of the pixels U is input to only one fixed signal processing unit SP through a corresponding bump electrode BE. However, a switch configured to switch the signal processing unit SP that is electrically connected to each of the pixels U may be provided.

The pad electrode PE1 or PE2 includes an electrode having not only a shape in which a width is greater than a thickness but also a shape in which the thickness is greater than the width. For example, a minimum thickness of the pad electrode PE1 or PE2 may be greater than a maximum width of the pad electrode PE1 or PE2. In this specification, the thickness of the pad electrode PE1 or PE2 represents a length in the Z-axis direction. The width of the pad electrode PE1 or PE2 represents a length in a direction orthogonal to the Z-axis direction.

In the embodiment and the modification example described above, the light detection region α is defined by the inner wall of the groove 13 that surrounds the light detection region α. However, the light detection region α may not be surrounded by the groove 13. In this case, when viewed from the Z-axis direction, an outer edge of the light detection region α matches an outer edge of the third semiconductor region NA or PD located at the outermost position.

In the embodiment and the modification example described above, the unit region α1 is defined by the inner wall of the groove 13 that surrounds the unit region α1. However, the unit region α1 may not be surrounded by the groove 13. In this case, when viewed from the Z-axis direction, the outer edge of the unit region α1 matches the outer edge of the third semiconductor region NA or PD located at the outermost position of the pixel U within the unit region α1.

REFERENCE SIGNS LIST

1: light detection device, 10, 10A: light detection substrate, 11: avalanche photodiode, 20: circuit substrate, 20d: edge, 21: quenching resistor, 41: signal acquisition unit, 42: timing measurement unit, 43: energy measurement unit, 44: storage unit, 50: semiconductor substrate, 60, 61: memory, 70: current-voltage conversion circuit, 75: signal transfer circuit, 77: Miller capacitor, 1Na, 1Nb: main surface, MP: measurement period, PE1, PE4: pad electrode, R1, R2, R3: portion, S: light-receiving region, SP: signal processing unit, U: pixel, VTH: threshold value, α: light detection region, α1, β1: unit region, β: signal processing region.

The invention claimed is:

1. A light detection device, comprising:
a light detection substrate that includes a semiconductor substrate including a first main surface and a second main surface opposite to each other, and a light detection region provided with a plurality of pixels, the plurality of pixels two-dimensionally arranged when viewed from a direction orthogonal to the first main surface; and
a circuit substrate that is connected to the light detection substrate in a direction orthogonal to the first main surface and includes a signal processing region provided with a plurality of signal processing units, the plurality of signal processing units each being configured to process a detection signal output from a corresponding one of the pixels,
wherein for each of the pixels, the light detection substrate includes,
a plurality of avalanche photodiodes, each of which includes a light-receiving region provided in the semiconductor substrate and is arranged to operate in Geiger mode,
a plurality of quenching resistors, each of which is electrically connected to a corresponding one of the avalanche photodiodes in series, and
a pad electrode to which the plurality of quenching resistors are electrically connected in parallel,
a plurality of the light-receiving regions of the plurality of avalanche photodiodes are two-dimensionally arranged for each of the pixels when viewed from a direction orthogonal to the first main surface,
each of the plurality of the signal processing units includes,
a signal acquisition unit configured to acquire the detection signal through a corresponding pad electrode, the corresponding pad electrode corresponding to the pad electrode,
a timing measurement unit configured to measure timing at which light is incident on a corresponding one of the pixels, based on the detection signal,
an energy measurement unit configured to measure energy of the light incident on a corresponding one of the pixels, based on the detection signal, and
a storage unit configured to store a measurement result in the timing measurement unit and the energy measurement unit, and
the light detection region and the signal processing region overlap each other at least at a part when viewed from a direction orthogonal to the first main surface.

2. The light detection device according to claim 1, wherein the light detection substrate is surrounded by an edge of the circuit substrate when viewed from a direction orthogonal to the first main surface.

3. The light detection device according to claim 1, wherein the light detection region includes a first portion that overlaps the signal processing region and a second portion that does not overlap the signal processing region, when viewed from a direction orthogonal to the first main surface, and
an area of the first portion is greater than an area of the second portion.

4. The light detection device according to claim 3, wherein the signal processing region includes a third portion that does not overlap the light detection region when viewed from a direction orthogonal to the first main surface, and
the area of the first portion is greater than the sum of the area of the second portion and an area of the third portion.

5. The light detection device according to claim 1, wherein a unit region where each of the pixels is provided in the light detection region and a unit region where one of the signal processing units which corresponds to the pixel in the signal processing region is provided overlap each other at least at a part when viewed from a direction orthogonal to the first main surface.

6. The light detection device according to claim 1, wherein a center of balance of the pad electrode deviates from a center of balance of a unit region where the signal processing unit to which the pad electrode is connected is provided toward the signal acquisition unit when viewed from a direction orthogonal to the first main surface.

7. The light detection device according to claim 5, wherein the unit region where each of the pixels is provided in the light detection region and the unit region where one of the signal processing units that corresponds to the pixel is provided in the signal processing region deviate from each other in a direction along the first main surface when viewed from a direction orthogonal to the first main surface, and include portions which do not overlap each other.

8. The light detection device according to claim 1, wherein the detection signal is a current signal, the signal acquisition unit of each of the signal processing units includes a current-voltage conversion circuit configured to convert the detection signal into a voltage, and a signal transfer circuit configured to input a voltage signal output from the current-voltage conversion circuit to the energy measurement unit, the signal transfer circuit includes a Miller capacitor that is connected to the energy measurement unit in parallel with the current-voltage conversion circuit, and the energy measurement unit measures energy of light incident on a corresponding one of the pixels, based on a waveform of a signal input from the signal transfer circuit.

9. The light detection device according to claim 1, wherein the energy measurement unit measures energy of light incident on a corresponding one of the pixels by measuring time for which a pulse height of a signal input from a corresponding signal acquisition unit is equal to or greater than a threshold value, and the corresponding signal acquisition unit corresponds to the signal acquisition unit.

10. The light detection device according to claim 1, wherein the storage unit of each of the signal processing units includes a plurality of storage regions configured to respectively store measurement results in the timing measurement unit and the energy measurement unit with respect to light incident on a corresponding one of the pixels at timings different from each other in a predetermined measurement period.

* * * * *